(12) United States Patent
Noguchi et al.

(10) Patent No.: US 7,125,930 B2
(45) Date of Patent: Oct. 24, 2006

(54) BLOCK COPOLYMER AND POLYMERIC LUMINESCENT ELEMENT

(75) Inventors: Takanobu Noguchi, Tsukuba (JP); Yoshiaki Tsubata, Tsukuba (JP); Shuji Doi, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/476,132

(22) PCT Filed: Apr. 24, 2002

(86) PCT No.: PCT/JP02/04060

§ 371 (c)(1),
(2), (4) Date: Oct. 27, 2003

(87) PCT Pub. No.: WO02/088223

PCT Pub. Date: Nov. 7, 2002

(65) Prior Publication Data

US 2004/0100804 A1    May 27, 2004

(30) Foreign Application Priority Data

Apr. 27, 2001  (JP) ............................. 2001-132002
Apr. 27, 2001  (JP) ............................. 2001-132011

(51) Int. Cl.
*C08L 25/08* (2006.01)
*C08F 112/02* (2006.01)

(52) U.S. Cl. .................. 525/89; 525/241; 525/133; 525/137; 526/346; 526/103

(58) Field of Classification Search .................. 525/89, 525/241, 101, 104; 526/346, 103
See application file for complete search history.

(56) References Cited

U.S. PATENT DOCUMENTS 5,589,320 A * 12/1996 Ohnishi et al. .............. 430/321
5,856,434 A     1/1999  Stern

FOREIGN PATENT DOCUMENTS

| EP | 0 637 621 A1 | 2/1995 |
|----|--------------|--------|
| EP | 0 672 741 A1 | 9/1995 |
| JP | 5-202355 A   | 8/1993 |
| JP | 2000-104057 A | 4/2000 |
| JP | 2000-154334 A | 6/2000 |
| JP | 2000-169839 A | 6/2000 |
| JP | 2000-252065 A | 9/2000 |
| WO | 92/03490 A1  | 3/1992 |

* cited by examiner

*Primary Examiner*—James J. Seidleck
*Assistant Examiner*—Olga Asinovsky
(74) *Attorney, Agent, or Firm*—Sughrue Mion, PLLC

(57) ABSTRACT

A block copolymer comprising two or more blocks and having fluorescence in the solid state, wherein blocks thereof may be the same or different, and in each of the blocks, one or more kinds of repeating units are bonded through conjugated bonds, and bonding between the blocks is made by junction unit having conjugated bond, and the polystyrene reduced number average molecular weight of at least one block is $1 \times 10^3$ to $1 \times 10^8$.

28 Claims, No Drawings

BLOCK COPOLYMER AND POLYMERIC LUMINESCENT ELEMENT

TECHNICAL FIELD

The present invention relates to a block copolymer having fluorescence in the solid state and a process for producing the same, and a polymer light-emitting device (hereinafter, sometimes referred to as a polymer LED) using the same.

BACKGROUND TECHNOLOGY

Unlike a low molecular weight light-emitting material, a polymer light-emitting material (polymeric fluorescent substance) is soluble in a solvent, and a light emitting layer in a light-emitting device can be formed by a coating method, and it has been variously studied.

For example, polyarylene type polymeric fluorescent substances are disclosed, such as, a polyfluorene (Jpn. J. Appl. Phys. volume 30, page L1941 (1991)), and a poly paraphenylene derivative (Adv. Mater. volume 4, page 36 (1992)).

As a block copolymer having fluorescence in the solid state used as a polymeric fluorescent substance, for example, JP-W-8-505167 discloses a block copolymer comprising blocks in which polythiophene are bonded not through $\pi$—$\pi$ conjugated bonds, and JP-W-11-60660 discloses a block copolymer comprising blocks in which polyethylene main chains have substituents of carbazole group and blocks which have substituents containing oxadiazole groups.

JP-A-2000-159846 discloses a block copolymer which is obtained by copolymerizing a block in which monomers having hole transportation property and electron transporting property are alternatively copolymerized, with a block in which monomers having hole transportation property are polymerized. Furthermore, JP-W-8-510483 discloses a copolymer of phenylene vinylene (PPV).

However, a block copolymer in which blocks are bonded through conjugated bond has not been known.

As the above conventional manufacture method of block copolymer, there have been known are: a process which is complicated such that functional groups are introduced after polymerizing block parts, and then the functional groups are reacted with other block parts (JP-W-8-505167); and a process which seems difficult to reliably construct block portions (JP-W-11-60660, JP-W-8-510483, JP-A-2000-159846). Anyway, there has been a problem that they are complicated.

An object of the present invention is to provide a new block copolymer having fluorescence in the solid state, and the blocks are bonded through conjugated bonds, and a polymer light-emitting device (hereinafter, sometimes referred to as "polymer LED").

DISCLOSURE OF THE INVENTION

The present invention relates to a block copolymer comprising two or more blocks and having fluorescence in the solid state, wherein blocks thereof may be the same or different, and in each of the blocks, one or more kinds of repeating units are bonded through conjugated bonds, and bonding between the blocks is made by junction unit having conjugated bond, and the polystyrene reduced number average molecular weight of at least one block is $1 \times 10^3$ to $1 \times 10^8$.

Furthermore, the present invention relates to a block copolymer comprising two or more blocks and having fluorescence in the solid state, wherein at least two blocks thereof are not the same each other, and in each of the blocks, one or more kinds of repeating units are bonded through conjugated bonds, and bonding between the blocks is made by a direct bond without interrupting the conjugated sequence, and the polystyrene reduced number average molecular weight of at least one block is $1 \times 10^3$ to $1 \times 10^8$. Moreover, in said block copolymer, the polystyrene reduced number average molecular weight of at least one block is suitably $2 \times 10^3$ to $1 \times 10^8$.

Furthermore, the block copolymer of the present invention is a block copolymer comprising two or more blocks, two of them are not the same, and in each of the blocks, one or more repeating units are bonded through $\pi$—$\pi$ conjugated bonds, having fluorescence in the solid state, and preferably, bonding between the blocks is made by $\pi$—$\pi$ conjugated bond.

The block copolymer of the present invention is, for example, represented by the following general formula (1a),

(in the formula, A and C show blocks which may be the same or different, and B shows a junction unit of not being a part of block, and having a conjugated bond.)

When A and C composed of only one kind of repeating unit, and A has a repeating unit a, which is the same repeating unit of C, the block copolymer is represented by

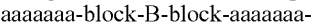

wherein, B is a junction unit.

When A differs from C, junction unit B may be contained or not contained. In this case, when the repeating unit constituting A is shown by a, and the repeating unit constituting C is shown by c, said block copolymer is represented by

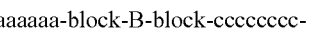

or

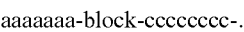

When either one of A and C is constituted by two or more kinds of repeating units, junction unit B may be contained or not contained.

For example, when the repeating unit which constitutes A is shown by a, and the repeating unit which constitutes C is shown by c, the block copolymer is represented by

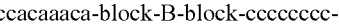

or preferably by,

Here, the "c"s which constitutes A and C may be the same of different, and the repeating units a and c which constitute A may be arranged either randomly or regularly.

In A and C, when the both composed of two or more kinds of repeating units, and A and C composed of the same repeating unit, junction unit B is contained.

For example, in both A and C, the repeating unit constituting thereof are a and c, the block copolymer is represented by

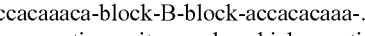

The repeating units a and c which constitute A and C may be arranged either randomly or regularly.

In case of both of A and C composed of two or more kinds of repeating units, when at least one repeating units which constitute A is not the same with the repeating unit which constitute C, or when at least one repeating units which constitute C is not the same with the repeating unit which constitute A, junction unit B may be contained or not contained.

For example, when the repeating units which constitute A are a, b and c, and the repeating units which constitute C is a and c, the block copolymer is represented by -acbacabacab-block-B-block-accacaacaor -acbacabacab-block-accacaaaca-.

In the above exemplification, when the block copolymer has junction unit B, the portion between junction unit and junction unit is referred to as "block".

The block copolymer of the present invention is a block copolymer which has fluorescence in the solid state, and for example, is represented by the above general formula (1a). In the formula, A and C represent blocks which may be the same or different, and B represents a junction unit having conjugated bond which is not a part of the block. It is preferable that the fluorescence peak wavelength shown by a thin film of the polymer represented by general formula (1a) is longer by 5 nm or more than the fluorescence peak wavelengths shown by either a thin film of the polymer solely composed of block A, or a thin film of the polymer solely composed of block C.

Furthermore, the block copolymer of the present invention is a block copolymer which has fluorescence in the solid state, and for example, is represented by the following general formula (1b).

-A-block-C- (1b)

Here, A and C represent different blocks, and bonding between the blocks is made by a direct bond without interrupting the conjugated sequence. It is preferable that the fluorescence peak wavelength shown by a thin film of the polymer represented by general formula (1b) is longer by 5 nm or more than the fluorescence peak wavelengths shown by a thin film of the polymer solely composed of block A.

In the present invention, the block copolymer particularly preferred, when values of the Lowest Unoccupied Molecular Orbital (LUMO) and the Highest Occupied Molecular Orbital (HOMO) of polymers consisting only of respective blocks are compared, is a block copolymer comprising two or more blocks having a relationships:

HOMO(D)>HOMO(E)

LUMO(D)<LUMO(E)

wherein D and E are at least a pair of neighboring blocks.

In a method for comparing numerical values of HOMO, when there is a sufficient difference between them, values corresponding to the ionization potential or work function obtained by calculation or by experiment may be compared. In a method for comparing numerical values of LUMO, when there is a sufficient difference between them, values corresponding to the electron affinity obtained by calculation or by experiment may be compared. Hereinafter, simple terms HOMO and LUMO extend to these parameters.

For calculating HOMO and LUMO, methods have been known in which they are calculated according to UPS (ultraviolet photoelectron spectroscopy) or molecular orbital method. The method in which values are calculated according to the molecular orbital method may become a preferred method when sufficient accuracy can be obtained in the future, but in the present state, it is difficult to apply this method to complicated polymers. Therefore, it is preferred to apply UPS or methods described below. Examples of method according to UPS include methods described in Polymer for Advanced Technologies, Vol. 9, Page 419 (1998) and literatures cited therein.

Methods for calculating HOMO include, in addition to UPS, a method according to photoelectron spectroscopy described in Japanese Patent 1234703, a method in which the electrochemically obtained oxidation potential is converted to such value.

The method described in Japanese Patent 1234703 can be carried out, for example, with an apparatus (AC-2) manufactured by Riken Keiki Co., Ltd. Specific examples of the method in which the electrochemically obtained oxidation potential is converted to such value include a method with the conversion of oxidation initiating potential of a material.

Specific methods for the oxidation initiating potential include the following electrochemical method. That is, the targeted material is subjected to the cyclic voltammetry and a potential at which an oxidation wave rises from the baseline (i.e. the oxidation initiating potential) is observed. Specifically, for example, a thin film is formed from a solution of a material to be analyzed on a platinum electrode by dipping. Then, the cyclic voltammetry is conducted in an organic solution containing a support electrolyte at an appropriate concentration, for example 0.1 N solution of tetrabutylammonium tetrafluoroborate in acetonitrile, using a platinum electrode coated with the material as a working electrode, another platinum electrode without coating as a counter electrode and a silver/silver chloride electrode, saturated calomel electrode, standard hydrogen electrode or the like, for example, as the reference electrode. When the material to be analyzed easily dissolves in a solution used as the electrolytic solution, the analysis may be carried out with an electrolytic solution containing the material dissolved therein in place of coating the electrode. The concentration in this case is selected such that the oxidation wave is easily detected.

Various conditions containing the sweep rate, sweep area and so on are identical for every analysis of materials and may be a sweep rate of 50 mV/second, a sweep area of −200 to 1500 mV (the potential for silver/silver chloride electrode) and the like. The potential at the intersection of the tangents which touches the baseline and the rising part of the oxidation wave, respectively, is measured in the obtained cyclic voltammogram.

When a value obtained by converting the obtained oxidation initiating potential to that for the standard hydrogen electrode is represented by Eox(V), HOMO can be calculated by the following equation:

HOMO=$Eox+C_1$ (eV)

wherein $C_1$ is a value for the vacuum potential of the standard hydrogen electrode and can be considered to be a constant. Usually, it is assumed to be 4.5.

Since, in the comparison of HOMO values (eV) for two materials, the constant Cs in the above equation are balanced, precise values need not be considered.

Examples of methods for calculating LUMO include, in addition to UPS described above, a method in which the electrochemically determined reduction potential is converted to such value, and a method in which the value is calculated from the absorption edge wavelength in the absorption spectrum of the material and the value of HOMO described above.

The method in which the electrochemically determined reduction potential is converted to such value can be carried out by calculating in a manner similar to the above method replacing the oxidation potential by the reduction potential.

In the method in which the value is calculated from the absorption edge wavelength in the absorption spectrum of the material and the value of HOMO described above, the absorption edge wavelength in the absorption spectrum can be obtained by measuring the absorption spectrum and observing the wavelength at which an absorption rises from the baseline. Specifically, for example, first a thin film having a thickness of about 50 to 300 nm is formed from a solution of a material to be analyzed on a quartz plate by a spin coating method, and an absorption spectrum is measured. In the spectrum, the wavelength at the intersection of the tangents which touches the baseline and the rising part of the absorption, respectively, is taken as the absorption edge wavelength.

When the obtained absorption edge wavelength is represented by λedge (nm), LUMO can be calculated by the following equation:

LUMO=HOMO−$C_2$/λedge (eV)

wherein $C_2$ is a value for changing the units and usually assumed to be 1239.

As HOMO, any values obtained by various methods described above can be used.

In the block copolymer of the present invention, it is more preferable that at least one of blocks A and C represented by the above formula (1a) or (1b) whose repeating units are connected by conjugated bond, has one or more kinds of the repeating units selected from the repeating unit represented by the below formula (2) or formula (3).

  (2)

(wherein, $Ar_1$ is an arylene group or a divalent heterocyclic compound group, and the arylene group and the divalent heterocyclic compound group may have a substituent. $R_1$ and $R_2$ each independently represent a group selected from a hydrogen atom, an alkyl group, an aryl group, a monovalent heterocyclic compound group, and cyano group, and the aryl group and the monovalent heterocyclic compound group may have a substituent. n is 0 or 1.)

—$Ar_2$—($CR_3$=$CR_4$)m-  (3)

(wherein, $Ar_2$ is a divalent aromatic amine group shown by the following general formula (4). $R_3$ and $R_4$ each independently represent the same group with those of $R_1$ and $R_2$, and m is 0 or 1.)

—$Ar_3$—N($Ar_4$)—$Ar_5$—  (4)

(wherein, $Ar_3$ and $Ar_5$ are each independently an arylene group, an aromatic compound group represented by the following general formula (5), or a group having an aromatic amine skelton of the following general formula (6), and $Ar_4$ represents an aryl group, a group having an aromatic amine skelton represented by the following general formula (7), or a group having an aromatic ethenylene skelton represented by the following general formula (8). A ring may be formed between $Ar_3$ and $Ar_4$, between $Ar_4$ and $Ar_5$, or between $Ar_3$ and $Ar_5$.

  (5)

(In the formula, $Ar_6$ and $Ar_7$ each independently show an arylene group, and the arylene group may have a substituent. $R_5$ and $R_6$ each independently represent the same group with those of $R_1$ and $R_2$, and l is 0 or 1.)

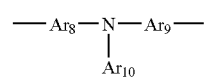  (6)

(wherein, $Ar_8$ and $Ar_9$ each independently show an arylene group and the arylene group may have a substituent. $Ar_{10}$ is an aryl group which may have a substituent. A ring may be formed between $Ar_8$ and $Ar_{10}$, between $Ar_8$ and $Ar_9$, or between $Ar_9$ and $Ar_{10}$.)

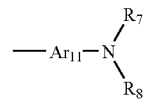  (7)

(wherein, $Ar_{11}$ show an arylene group and the arylene group may have a substituent. $R_7$ and $R_8$ each independently represent a group of $R_1$ and $R_2$, and they may form a ring between $Ar_{11}$ and $R_7$, between $Ar_{11}$ and $R_8$, or between $R_7$ and $R_8$.)

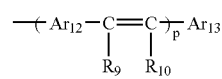  (8)

(In the formula, $Ar_{12}$ and $Ar_{13}$ each independently show an arylene group, and the arylene group may have a substituent. $R_9$ and $R_{10}$ each independently represent a group of $R_1$ and $R_2$, and p is 0 or 1.)

$Ar_2$ shown by the above formula (3) is preferably a group represented by the below formula (9).

—($Ar_{14}$—N($Ar_{15}$))$_t$—$Ar_{16}$—  (9)

(wherein, $Ar_{14}$ and $Ar_{16}$ represent the same group with those of $Ar_3$, and $Ar_5$ and $Ar_{15}$ represent the same group with those of $Ar_4$. t is 1 or 2.)

In the present invention, junction unit B having a conjugated bond is not restricted so long that it is a conjugated system which is not a part of block. It is preferably an arylene group shown by the above formula (2), a divalent heterocyclic compound group, an arylenevinylene group, and a divalent aromatic amino group shown by the above formula (3) or (9).

Furthermore, as junction unit B, when n is 0 in the above formula (2), and when m is 0 in the above formula (3), the structure represented by the following general formula (10) is preferable.

  (10)

(In the formula, $Ar_{17}$ and $Ar_{18}$ represent an arylene group or a divalent heterocyclic compound group, and $R_{11}$ and $R_{12}$ represent the same group with those of $R_1$ and $R_2$.)

Moreover, when n is 1 in the above formula (2), and m is 1 in the above formula (3), it is preferable that the junction unit B has a structure represented by the following formula (11).

  (11)

(In the formula, $Ar_{19}$ is an arylene group or a divalent heterocyclic compound group.)

Although the process for producing the block copolymer in the present invention is not especially limited as long as the structure mentioned above is produced, the following processess are preferable for structure controlling.

[1] A process for producing a block copolymer, wherein an initial polymer having a group ($Y_1$) on the molecular terminal, is obtained by reacting a monomer (I) having two reactive groups ($X_1$, $X_2$) in a molecule which can react mutually, with a monomer (II) having a reactive group ($X_3$) which is reactive with the reactive groups ($X_1$, $X_2$) and a group ($Y_1$) which is not reactive with the reactive groups ($X_1$, $X_2$) under a reaction condition at which said reactive groups ($X_1$, $X_2$) can react with $X_3$ to form a linkage; and said initial polymer is reacted under a condition at which group ($Y_1$) can mutually react to form linkage.

[2] A process for producing a block copolymer, wherein an initial polymer having a group ($Y_1$) on the molecular terminal, is obtained by reacting a monomer (I) having two reactive groups ($X_1$, $X_2$) in a molecule which can react mutually, with a monomer (II) having a reactive group ($X_3$) which is reactive with the reactive groups ($X_1$, $X_2$) and a group ($Y_1$) which is not reactive with the reactive groups ($X_1$, $X_2$) under a reaction condition at which said reactive groups ($X_1$, $X_2$) can react with $X_3$ to form a linkage; and said initial polymer is reacted with a monomer (III) having two groups ($Y_2$, $Y_3$) in a molecule which is reactive with a group ($Y_1$) to form a linkage under a reaction condition at which groups ($Y_2$, $Y_3$) can react with group ($Y_1$) to form a linkage In the process of the present invention, although it is not limited, it is suitable that groups ($Y_1$, $Y_2$, $Y_3$) react among themselves to form π—π bonds, and it is more preferable that the π—π bond is a double bond or aryl-aryl bond.

In the process of the present invention, although the structure of the monomer to be used is not limited, those having following structures are preferable.

That is, it is preferable that one or more kinds of monomer (I) selected from the below formula (12), and one or more kinds of monomer (II) selected from the below formula (13) are reacted to form an initial polymer, and then one or more kinds of the initial polymer are reacted among themselves, or reacted with one or more kinds of monomer (III).

As for the polymer having reactive group, a homopolymer or a copolymer is produced according to the kind of repeating unit $Ar_{20}$ which constitutes the polymer.

When the repeating unit $Ar_{20}$ consists of a single compound, a homopolymer is formed, and when the repeating unit $Ar_{20}$ consists of two or more kinds of compounds, an alternating copolymer or a random copolymer is usually formed.

Preferable monomer (I) is shown by the following general formula (12).

  (12)

(wherein, $X_1$ and $X_2$ show reactive groups which react mutually and can form a linkage, these may be the same or different. $Ar_{20}$ represents the same group with those of the above $Ar_1$.)

Moreover, preferable monomer (II) is shown by the following general formula (13).

  (13)

(wherein, $Ar_{21}$ represents the same group with those of $Ar_1$. $X_3$ represents a reactive group which reacts with the above $X_1$ and $X_2$ to form a linkage, and $Y_1$ represents a group which does not react under a reaction condition at which $X_1$, $X_2$, and $X_3$ react to form a linkage.)

The initial polymer obtained by the above process is represented by the following general formula.

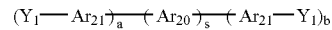

(wherein, s shows a integer of 1 or more. a, and b is 1.)

Preferable monomer (III) is shown by the below formula (14).

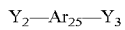  (14)

(wherein, $Ar_{25}$ represents the same group with those of $Ar_1$. $Y_2$ and $Y_3$ each independently represents the same group with those of $Y_1$, and these may be the same or different.)

As the arylene group, exemplified are phenylene group (for example, formulas 1–3), naphthalene-diyl group (following formulas 4–13), anthracenylene group (following formulas 14–19), biphenylene group (following formulas 20–25), fluorene-diyl group (following formulas 36–38), triphenylene group (following formulas 26–28), stilbene-diyl (following formulas A–D), distilbene-diyl (following formulas E and F), condensed-ring compound group (following formulas 29–38) etc. Among them, phenylene group, biphenylene group, fluorene-diyl group, and stilbene-diyl group are preferable.

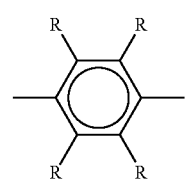

1

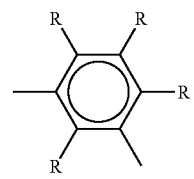

2

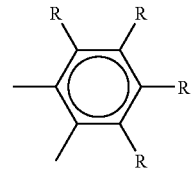

3

-continued
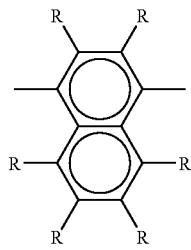
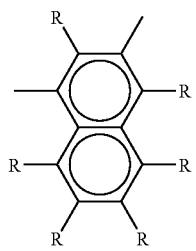
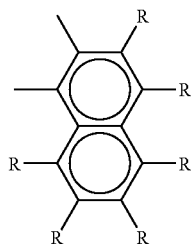
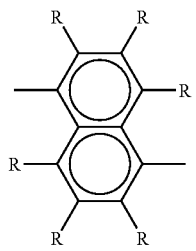
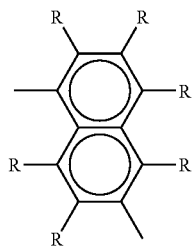
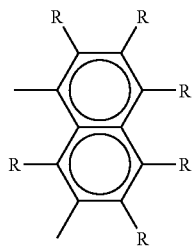
-continued
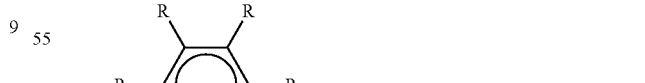

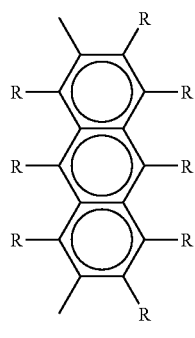
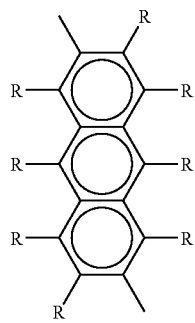
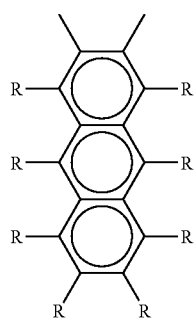
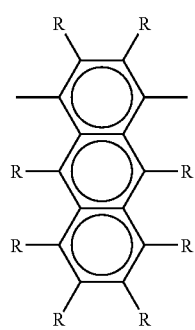
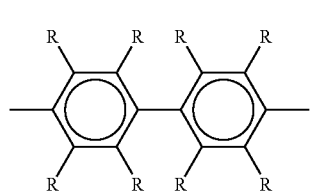
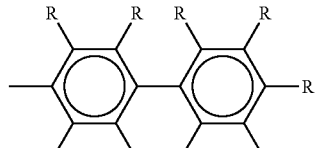
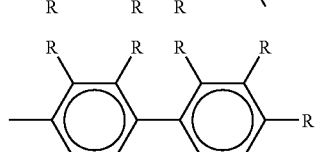
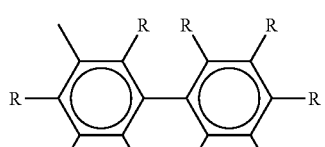
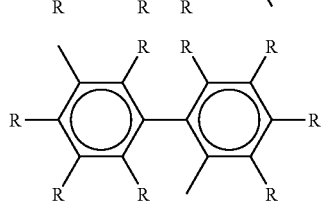
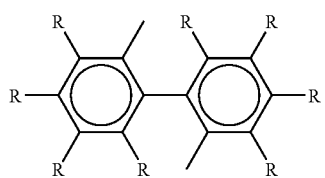
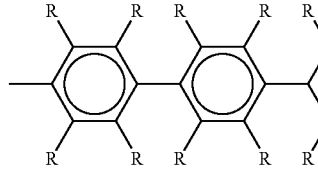
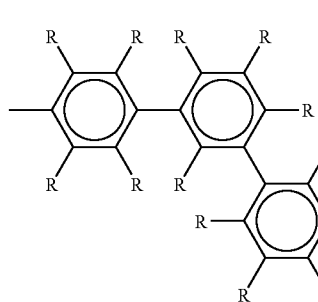

-continued
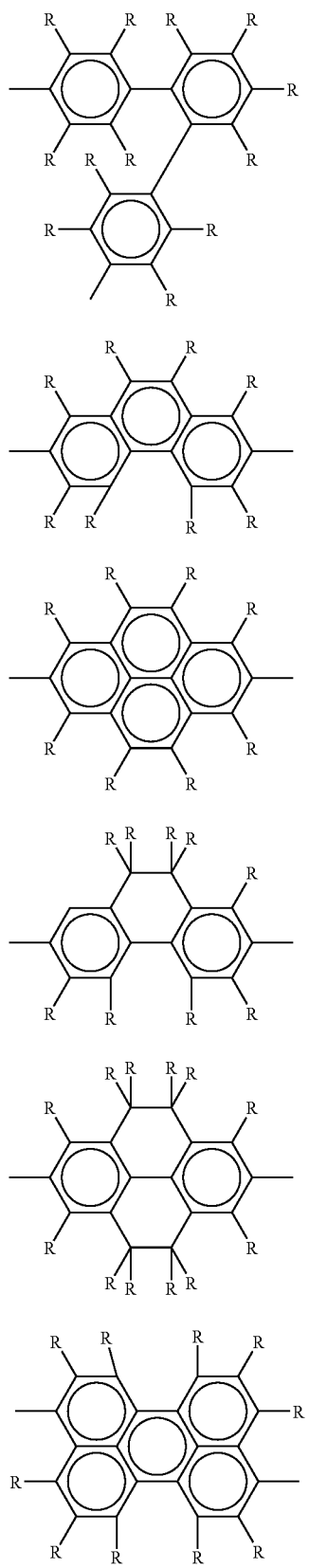
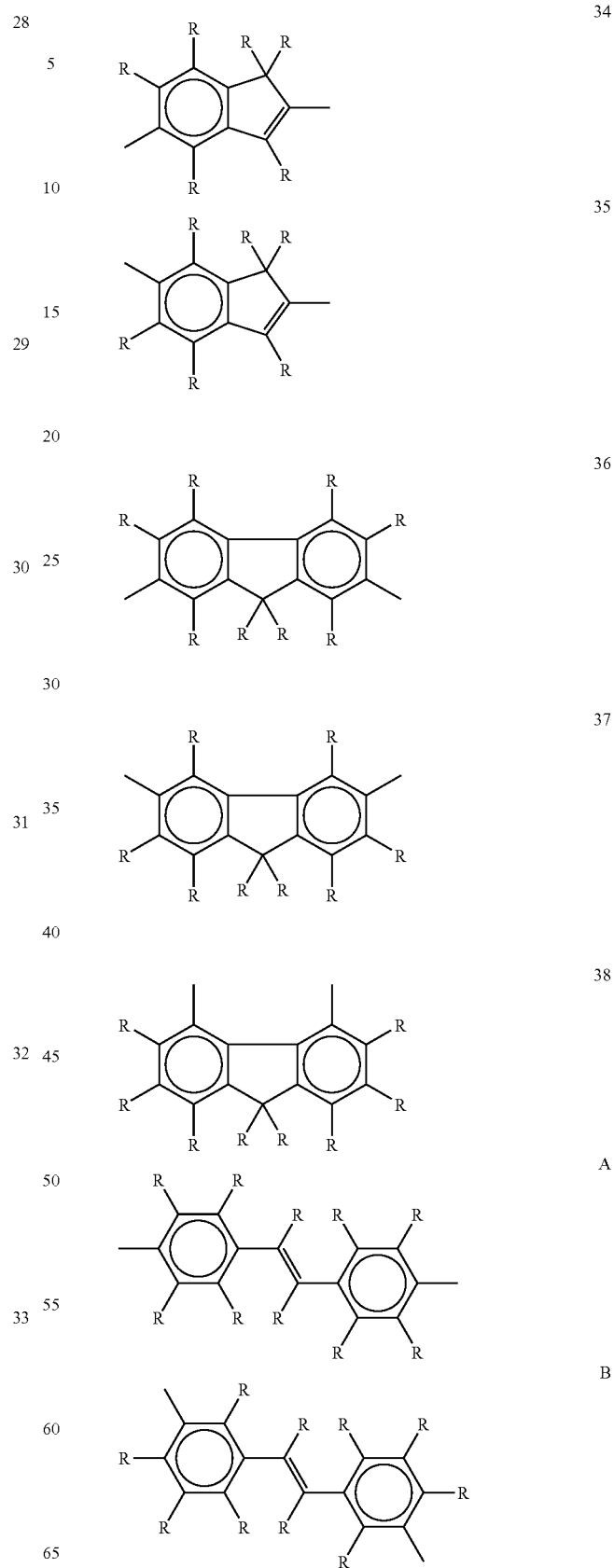

-continued

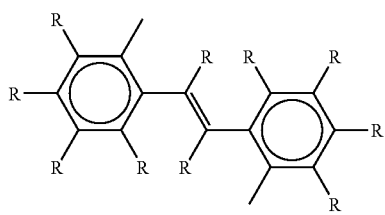
C

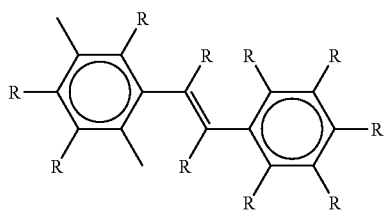
D

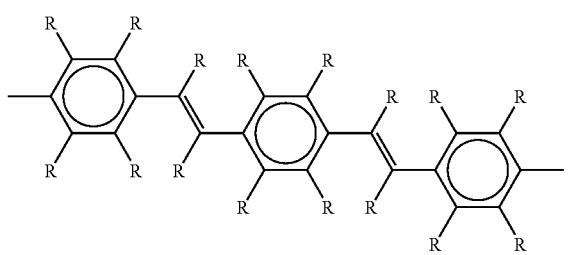
E

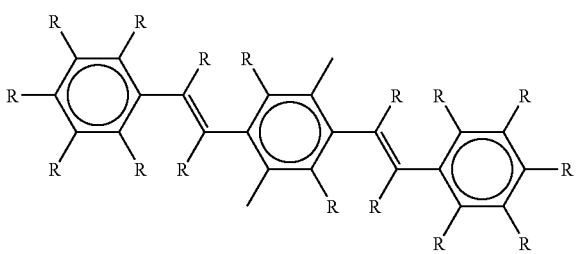
F atom, such as silicon, nitrogen, sulfur, selenium, etc. and having a fluorene structure (following formulas 79–93).

5 membered-ring heterocyclic compound groups containing a hetero atom such as silicon, nitrogen, sulfur, selenium, etc. (following formulas 94–98).

5 membered-ring condensed heterocyclic compound groups containing a hetero atom such as silicon, nitrogen, sulfur, selenium, etc. (following formulas 99–108).

Groups in which 5 membered ring heterocyclic compound group containing silicon, nitrogen, sulfur, selenium, etc. as a hetero atom is connected with a phenyl group at the a position of the hetero atom to form a dimer or oligomer (following formulas 109–113).

Groups in which 5 membered ring heterocyclic compound group containing silicon, nitrogen, sulfur, selenium, etc. as a hetero atom is connected with a phenyl group at the a position of the hetero atom (following formulas 113–119).

Groups in which 5 membered ring heterocyclic compound group containing oxygen, nitrogen, sulfur, etc. as a hetero atom is connected with a phenyl group, a furyl group, or thienyl group (following formulas 120–125).

In the present invention, the divalent heterocyclic group means an atomic group in which two hydrogen atoms are removed from a heterocyclic compound, and the number of carbon atoms is usually about 3 to 60.

The heterocyclic compound means an organic compound having a cyclic structure in which at least one heteroatom such as oxygen, sulfur, nitrogen, phosphorus, boron, arsenic, etc. is contained in the cyclic structure as the element other than carbon atoms.

As the divalent heterocyclic compound group, followings are exemplified.

Divalent heterocyclic groups containing a nitrogen as a hetero atom; pyridine-diyl group (following formulas 39–44), diazaphenylene group (following formulas 45–48), quinoline-diyl group (following formulas 49–63), quinoxaline-diyl group (following formulas 64–68), acridine-diyl group (following formulas 69–72), bipyridyl-diyl group (following formulas 73–75), phenanthroline-diyl group (following formulas 76–78), etc.; groups containing a hetero

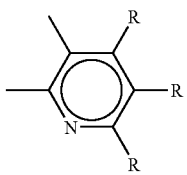
39

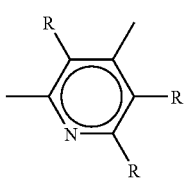
40

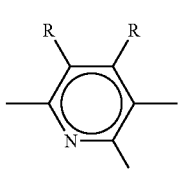
41

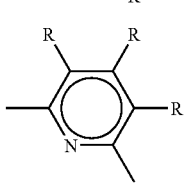
42

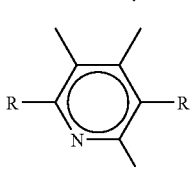
43

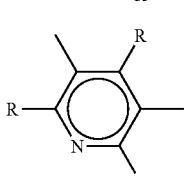
44

-continued
45
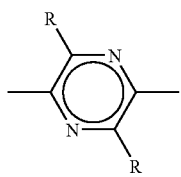
46
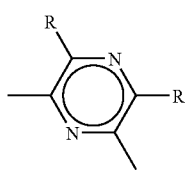
47
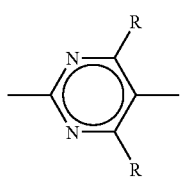
48
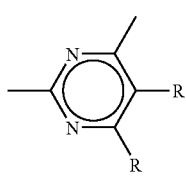
49
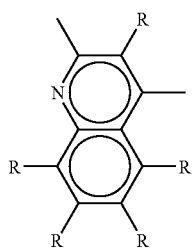
50
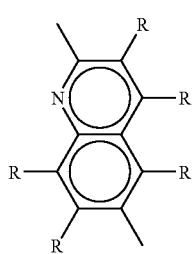
51
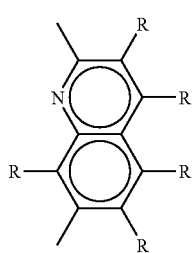
-continued
52
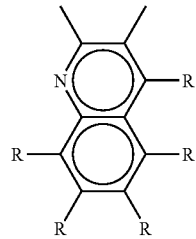
53
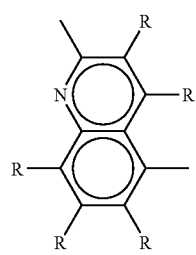
54
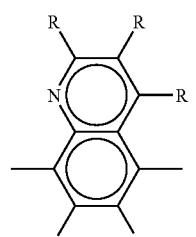
55
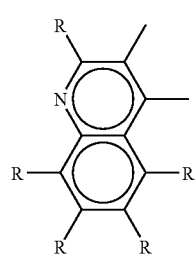
56
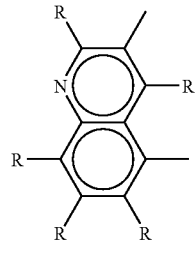
57
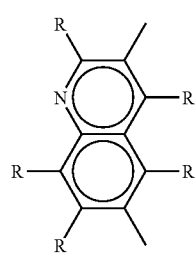

-continued
58 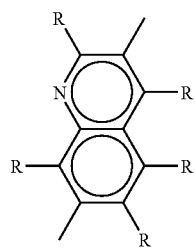
59 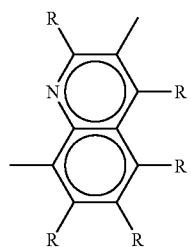
60 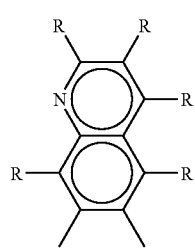
61 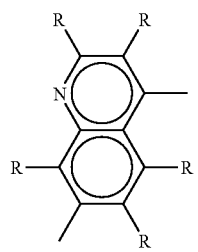
62 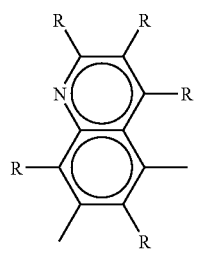
63 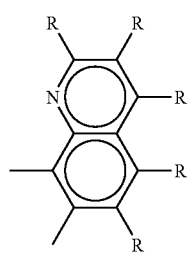
-continued
64 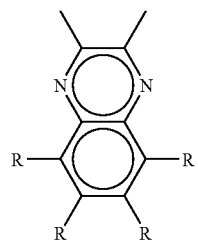
65 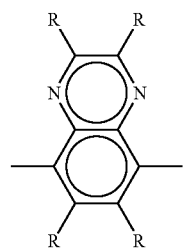
66 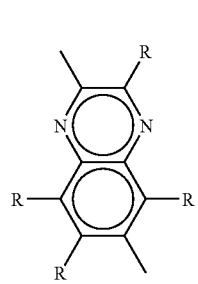
67 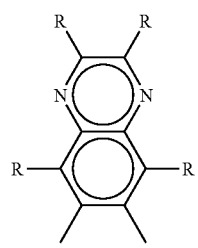
68 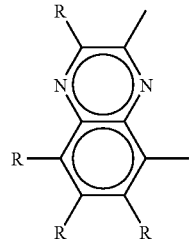
69 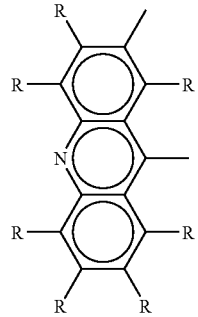

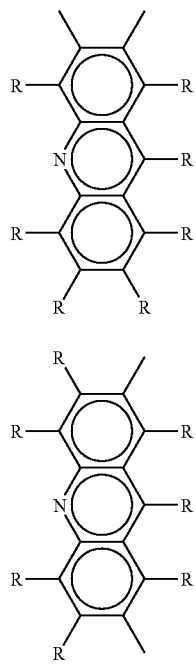
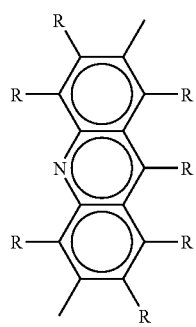
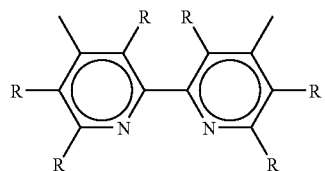
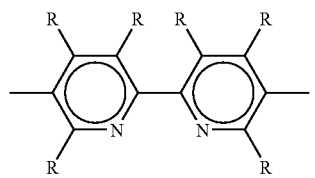
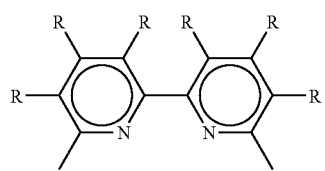
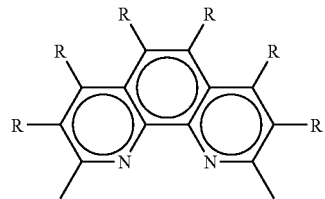
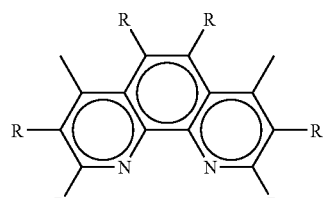
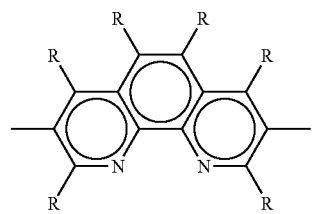
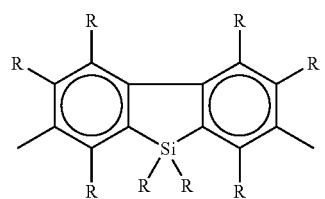
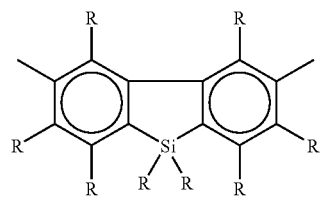
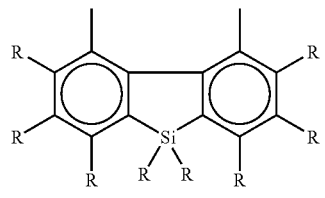
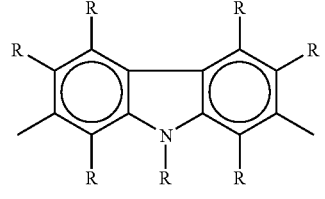

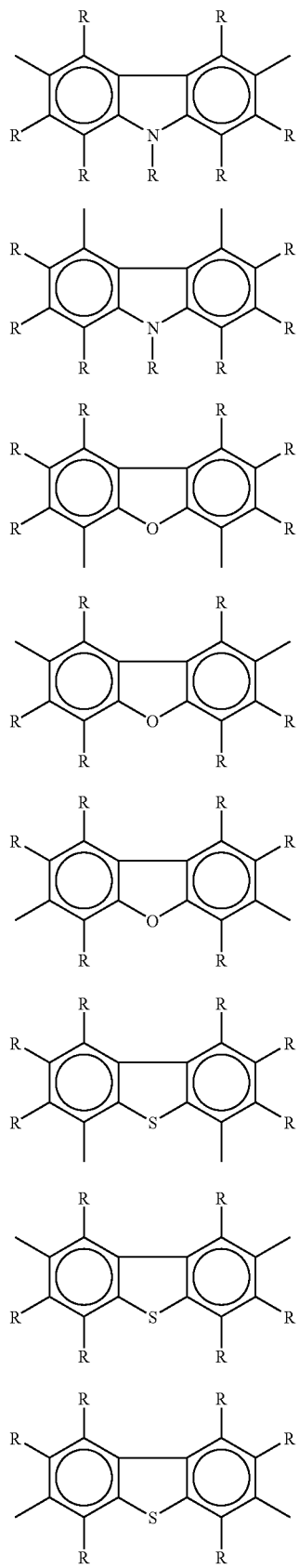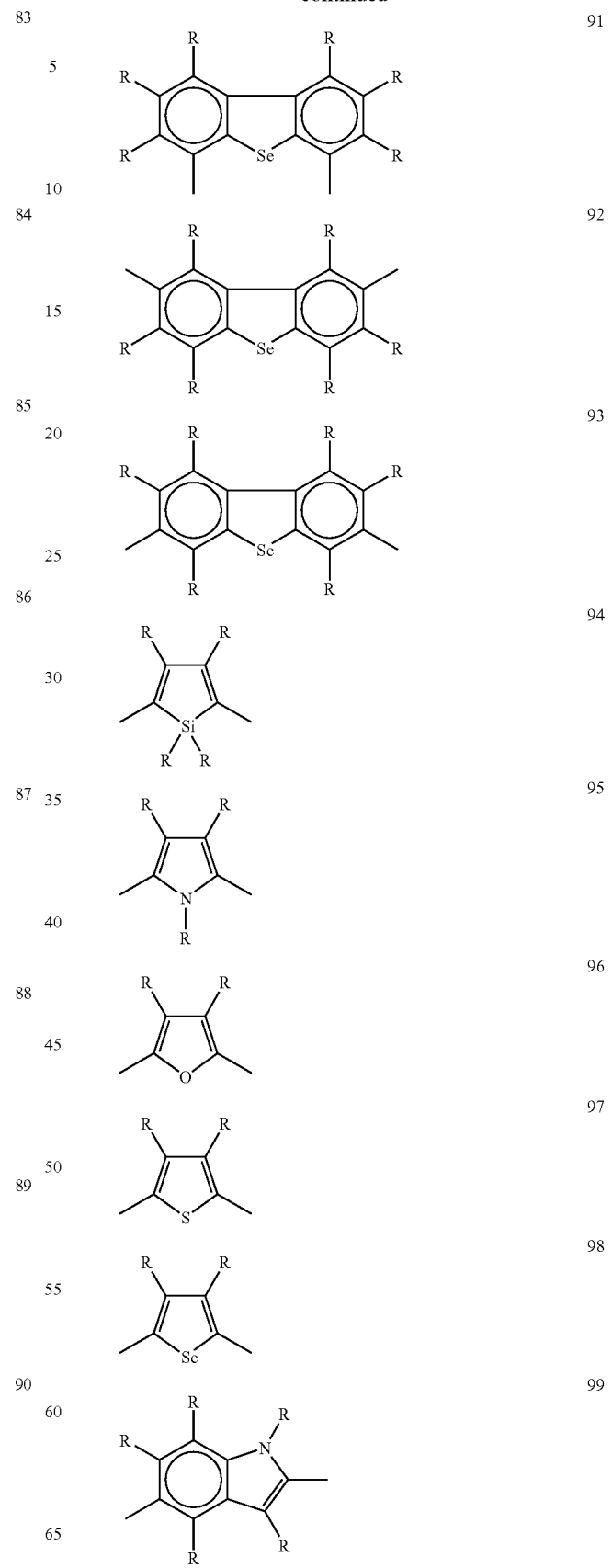

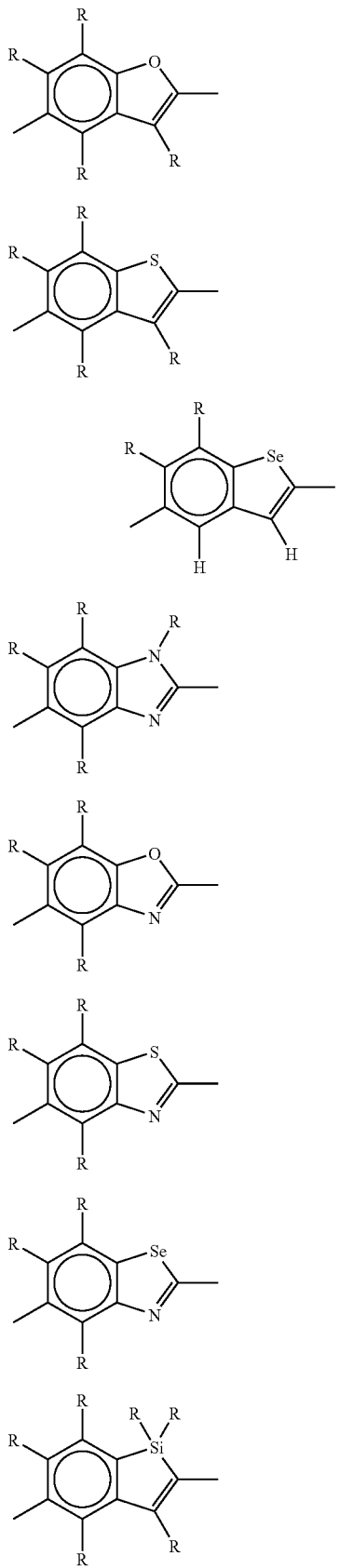
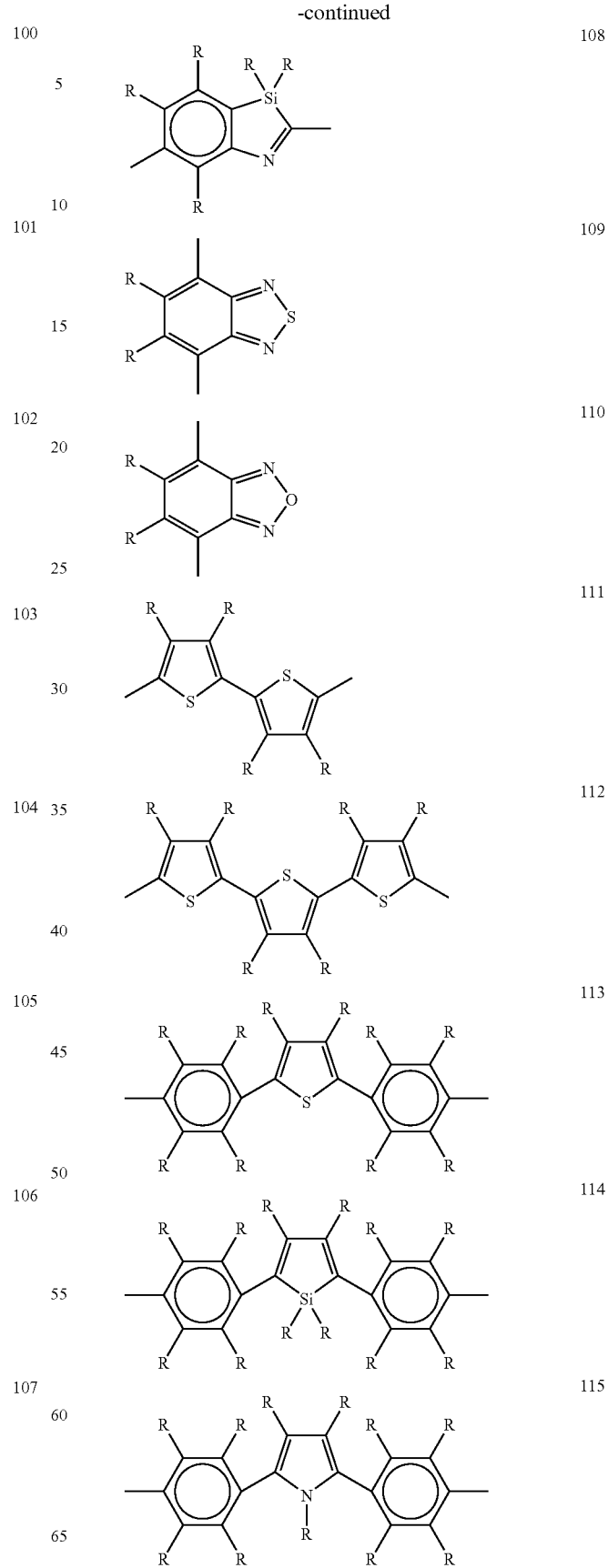

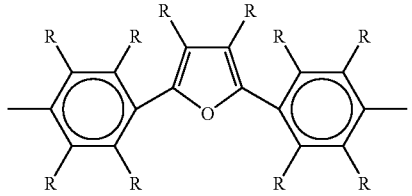

116

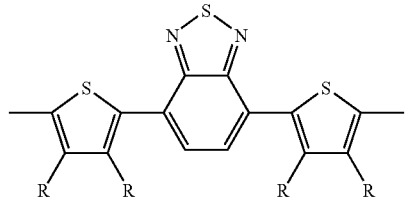

122

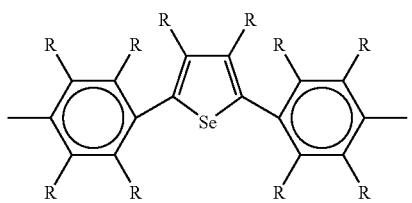

117

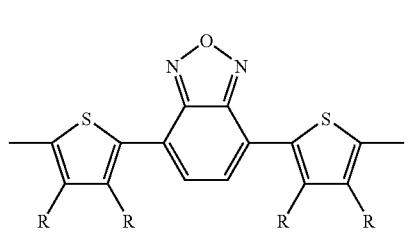

123

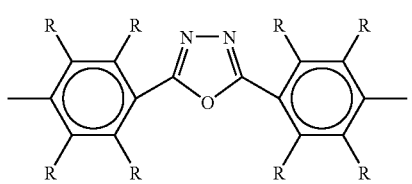

118

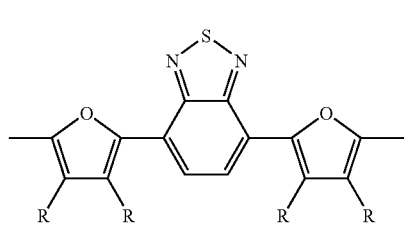

124

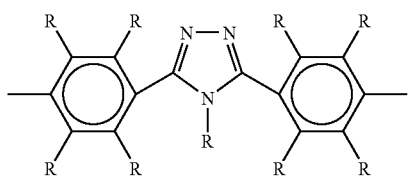

119

125

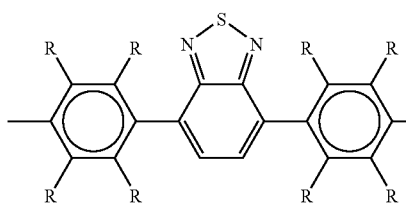

120

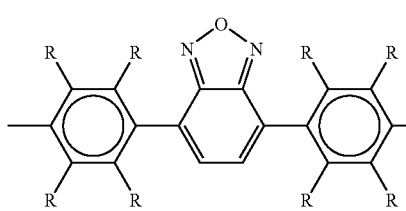

121

In the example shown by the above formulas 1–125, R each independently shows a hydrogen atom, an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group. The carbon atom in the groups of formulas 1–132 may be replaced with a nitrogen atom, oxygen atom, or sulfur atom, and the hydrogen-atom may be replaced with a fluorine atom.

In the present invention, the divalent aromatic amine group means an atomic group in which two hydrogen atoms are removed from an aromatic amine, and the number of carbon atoms is usually about 4 to 60, and more specifically, following groups are exemplified.

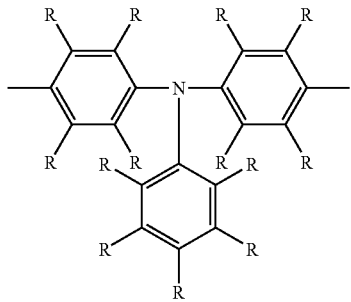
126
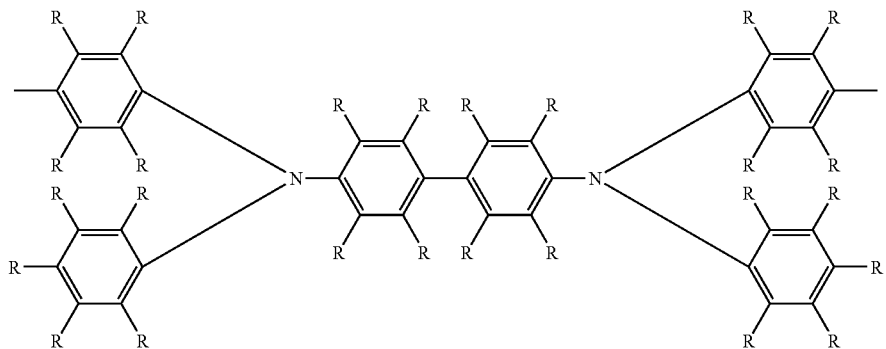
127
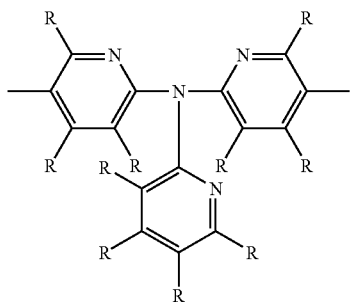
128
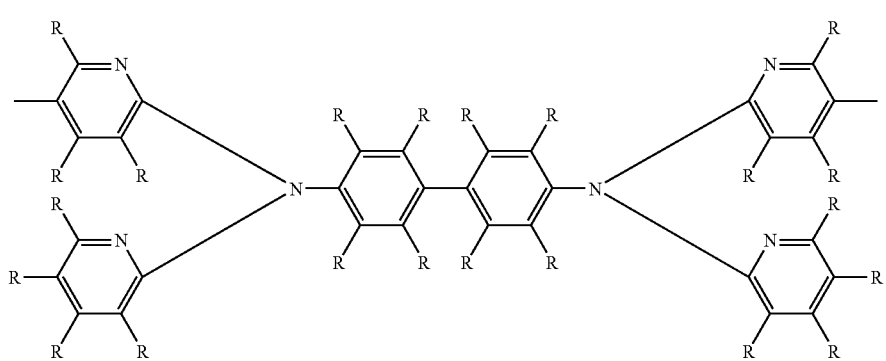
129

-continued

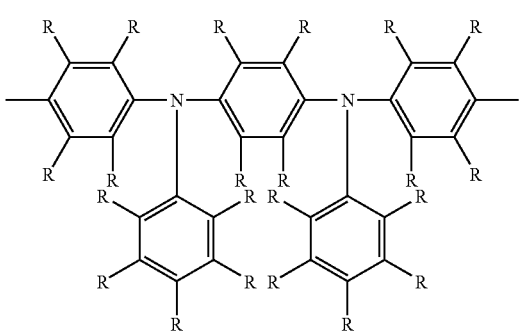

130

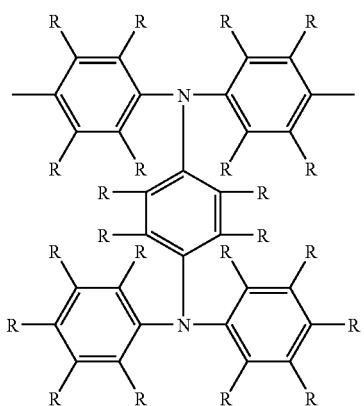

131

In the above formula, R is the same as those of the above formulas 1–125. In the above example, although a plurality of Rs are contained in one structural formula, they may be the same or different. In order to improve the solubility in a solvent, it is preferable to have one or more groups other than a hydrogen atom, and it is preferable that the symmetry of the repeating unit including the substituent is little.

The alkyl group in the present invention may be any of linear, branched or cyclic, and usually has about 1 to 20 carbon atoms. Specific examples thereof include methyl group, ethyl group, propyl group, i-propyl group, butyl group, i-butyl group, t-butyl group, pentyl group, hexyl group, cyclohexyl group, heptyl group, octyl group, 2-ethyl hexyl group, nonyl group, decyl group, 3,7-dimethyloctyl group, lauryl group, trifluoromethyl group, pentafluoroethyl group, perfluorobutyl, perfluorohexyl group, perfluorooctyl group, etc. Pentyl group, hexyl group, octyl group, 2-ethyl hexyl group, decyl group, and 3,7-dimethyloctyl group are preferable.

The alkoxy group may be any of linear, branched or cyclic, and usually has about 1 to 20 carbon atoms. Specific examples thereof include methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyl group, perfluorooctyl group, methoxymethyloxy group, 2-methoxyethyloxy group, etc. Pentyloxy group, hexyloxy group, octyloxy group, 2-ethylhexyloxy group, decyloxy group, and 3,7-dimethyl octyloxy group are preferable.

The alkylthio group may be any of linear, branched or cyclic, and usually has about 1 to 20 carbon atoms. Specific examples thereof include methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group, etc. Pentylthio group, hexylthio group, octylthio group, 2-ethylhexylthio group, decylthio group, and 3,7-dimethyloctylthio group are preferable.

The aryl group usually has about 6 to 60 carbon atoms. Specific examples thereof include phenyl group, $C_1$–$C_{12}$ alkoxyphenyl group ($C_1$–$C_{12}$ shows carbon number of 1–12. Hereinafter, the same ), $C_1$–$C_{12}$ alkylphenyl group, 1-naphthyl group, 2-naphthyl group, 1-anthracenyl group, 2-anthracenyl group, 9-anthracenyl group, pentafluorophenyl group, etc. $C_1$–$C_{12}$ alkoxyphenyl group, and $C_1$–$C_{12}$ alkylphenyl group are prererable. The aryl group is an atomic group in which a hydrogen atom is removed from an aromatic hydrocarbon. The aromatic hydrocarbon includes those containing a condensed ring, and those containing two or more of independent benzene rings or condensed rings bonded through a group such as a direct bond, a vinylene group or the like.

Examples of $C_1$–$C_{12}$ alkoxy include methoxy, ethoxy, propyloxy, i-propyloxy, butoxy, i-butoxy, t-butoxy, pentyloxy, hexyloxy, cyclohexyl oxy, heptyloxy, octyloxy, 2-ethyl hexyloxy, nonyloxy, decyloxy, 3,7-dimethyloctyloxy, lauryloxy, etc.

Examples of $C_1$–$C_{12}$ alkylphenyl group include methylphenyl group, ethylphenyl group, dimethylphenyl group, propylphenyl group, mesityl group, methylethylphenyl group, i-propylphenyl group, butylphenyl group, i-butylphenyl group, t-butylphenyl group, pentylphenyl group, isoamylphenyl group, hexylphenyl group, heptylphenyl group, octylphenyl group, nonylphenyl group, decylphenyl group, dodecylphenyl group, etc.

The aryloxy group usually has about 6 to 60 carbon atoms. Specific examples thereof include phenoxy group, $C_1$–$C_{12}$ alkoxyphenoxy group, $C_1$–$C_{12}$ alkylphenoxy group, 1-naphtyloxy group, 2-naphtyloxy group, pentafluorophenyloxy group, etc. $C_1$–$C_{12}$ alkoxyphenoxy group, and $C_1$–$C_{12}$ alkylphenoxy group are preferable.

Examples of $C_1$–$C_{12}$ alkoxy include methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy, etc.

Examples of $C_1$–$C_{12}$ alkyl phenoxy group include methyl phenoxy group, ethylphenoxy group, dimethylphenoxy group, propylphenoxy group, 1,3,5-trimethylphenoxy group, methylethylphenoxy group, i-propylphenoxy group, butylphenoxy group, i-butylphenoxy group, t-butylphenoxy group, pentylphenoxy group, isoamylphenoxy group, hexylphenoxy group, heptylphenoxy group, octylphenoxy group, nonylphenoxy group, decylphenoxy group, dodecylphenoxy group, etc.

The arylthio group usually has about 3 to 60 carbon atoms, and examples thereof include phenylthio group, $C_1$–$C_{12}$ alkoxyphenylthio group, $C_1$–$C_{12}$ alkylphenylthio group, 1-naphthylthio group, 2-naphthylthio group, pentafluorophenylthio group, etc. $C_1$–$C_{12}$ alkoxyphenylthio group, and $C_1$–$C_{12}$ alkylphenylthio group of carbon number are preferable.

The arylalkyl group usually has about 7 to 60 carbon atoms. Examples thereof include phenyl-$C_1$–$C_{12}$ alkyl group, $C_1$–$C_{12}$ alkoxyphenyl-$C_1$–$C_{12}$ alkyl group, $C_1$–$C_{12}$ alkylphenyl-$C_1$–$C_{12}$ alkyl group, 1-naphtyl-$C_1$–$C_{12}$ alkyl group, 2-naphtyl-$C_1$–$C_{12}$ alkyl group, etc. $C_1$–$C_{12}$ alkoxyphenyl-$C_1$–$C_{12}$ alkyl group, and $C_1$–$C_{12}$ alkylphenyl-$C_1$–$C_{12}$ alkyl group are preferable.

The arylalkoxy group usually has about 7 to 60 carbon atoms. Examples thereof include phenyl-$C_1$–$C_{12}$ alkoxy group, such as phenylmethoxy group, phenylethoxy group, phenylbutoxy group, phenylpentyloxy group, phenylhexyloxy group, phenylheptyloxy group, and phenyl octyloxy group; $C_1$–$C_{12}$ alkoxyphenyl-$C_1$–$C_{12}$ alkoxy group, $C_1$–$C_{12}$ alkylphenyl-$C_1$–$C_{12}$ alkoxy group, 1-naphtyl-$C_1$–$C_{12}$ alkoxy group, 2-naphtyl-$C_1$–$C_{12}$ alkoxy group, etc. $C_1$–$C_{12}$ alkoxyphenyl-$C_1$–$C_{12}$ alkoxy group, and $C_1$–$C_{12}$ alkylphenyl-$C_1$–$C_{12}$ alkoxy group are preferable.

The arylalkylthio group usually has about 7 to 60 carbon atoms. Examples thereof include phenyl-$C_1$–$C_{12}$ alkylthio group, $C_1$–$C_{12}$ alkoxyphenyl-$C_1$–$C_{12}$ alkylthio group, $C_1$–$C_{12}$ alkylphenyl-$C_1$–$C_{12}$ alkylthio group, 1-naphtyl-$C_1$–$C_{12}$ alkylthio group, 2-naphtyl-$C_1$–$C_{12}$ alkylthio group, etc. $C_1$–$C_{12}$ alkoxyphenyl-$C_1$–$C_{12}$ alkylthio group, and $C_1$–$C_{12}$ alkylphenyl-$C_1$–$C_{12}$ alkylthio group are preferable.

The arylalkenyl group usually has about 7 to 60 carbon atoms. Examples thereof include phenyl-$C_2$–$C_{12}$ alkenyl group, $C_1$–$C_{12}$ alkoxyphenyl-$C_2$–$C_{12}$ alkenyl group, $C_1$–$C_{12}$ alkylphenyl-$C_2$–$C_{12}$ alkenyl group, 1-naphtyl-$C_2$–$C_{12}$ alkenyl group, 2-naphtyl-$C_2$–$C_{12}$ alkenyl group, etc. $C_1$–$C_{12}$ alkoxyphenyl-$C_2$–$C_{12}$ alkenyl group, and $C_2$–$C_{12}$ alkylphenyl $C_1$–$C_{12}$ alkenyl group are preferable.

The arylalkynyl group usually has about 7 to 60 carbon atoms. Examples thereof include phenyl-$C_2$–$C_{12}$ alkynyl group, $C_1$–$C_{12}$ alkoxyphenyl-$C_2$–$C_{12}$ alkynyl group, $C_1$–$C_{12}$ alkylphenyl-$C_2$–$C_{12}$ alkynyl group, 1-naphtyl-$C_2$–$C_{12}$ alkynyl group, 2-naphtyl-$C_2$–$C_{12}$ alkynyl group, etc. $C_1$–$C_{12}$ alkoxyphenyl-$C_2$–$C_{12}$ alkynyl group, and $C_1$–$C_{12}$ alkylphenyl-$C_2$–$C_{12}$ alkynyl group are preferable.

The substituted amino group is an amino group which has one or two substituents selected from an alkyl group, aryl group, arylalkyl group, or monovalent heterocyclic group. The alkyl group, aryl group, arylalkyl group, or monovalent heterocyclic group may have a substituent. The number of carbon atoms is usually about 1 to 60 without including the carbon atoms of the substituent.

Examples thereof include methylamino group, dimethylamino group, ethylamino group, diethylamino group, propylamino group, dipropylamino group, i-propylamino group, diisopropylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, cyclopentylamino group, dicyclopentylamino group, cyclohexyl amino group, dicyclohexylamino group, pyrrolidyl group, piperidyl group, ditrifluoromethylamino group, phenylamino group, diphenylamino group, $C_1$–$C_{12}$ alkoxyphenylamino group, di($C_1$–$C_{12}$ alkoxyphenyl) amino group, di($C_1$–$C_{12}$ alkyl henyl) amino group, 1-naphtylamino group, 2-naphtylamino group, pentafluorophenylamino group, pyridylamino group, pyridazinylamino group, pyrimidylamino group, pyrazylamino group, triazylamino group phenyl-$C_1$–$C_{12}$ alkylamino group, $C_1$–$C_{12}$ alkoxyphenyl-$C_1$–$C_{12}$ alkylamino group, $C_1$–$C_{12}$ alkylphenyl-$C_1$–$C_{12}$ alkylamino group, di($C_1$–$C_{12}$ alkoxyphenyl-$C_1$–$C_{12}$ alkyl)amino group, di($C_1$–$C_{12}$ alkylphenyl-$C_1$–$C_{12}$ alkyl)amino group, 1-naphtyl-$C_1$–$C_{12}$ alkylamino group, 2-naphtyl-$C_1$–$C_{12}$ alkylamino group, etc.

The substituted silyl group is a silyl group which has 1 to 3 substituents selected from an alkyl group, aryl group, arylalkyl group, or monovalent heterocyclic group. The number of carbon atoms is usually about 1 to 60. The alkyl group, aryl group, arylalkyl group, or monovalent heterocyclic group may have a substituent.

Examples thereof include trimethylsilyl group, triethyl silyl group, tripropylsilyl group, tri-i-propylsilyl group, dimethyl-i-propyl silyl group, diethyl-i-propyl silyl group, t-butylsilyldimethylsilyl group, pentyldimethylsilyl group, hexyldimethylsilyl group, heptyldimethylsilyl group, octyl dimethylsilyl group, 2-ethylhexyl-dimethylsilyl group, nonyl dimethylsilyl group, decyldimethylsilyl group, 3,7-dimethyl octyl-dimethylsilyl group, lauryldimethylsilyl group, phenyl-$C_1$–$C_{12}$ alkylsilyl group, $C_1$–$C_{12}$ alkoxyphenyl-$C_1$–$C_{12}$ alkylsilyl group, $C_1$–$C_{12}$ alkylphenyl-$C_1$–$C_{12}$ alkylsilyl group, 1-naphtyl-$C_1$–$C_{12}$ alkylsilyl group, 2-naphtyl-$C_1$–$C_{12}$ alkylsilyl group, phenyl-$C_1$–$C_{12}$ alkyldimethylsilyl group, triphenylsilyl group, tri-p-xylylsilyl group, tribenzyl silyl group, diphenylmethylsilyl group, t-butyldiphenyl silyl group, dimethylphenyl silyl group, etc.

As the halogen atom, a fluorine atom, chlorine atom, bromine atom, and iodine atom are exemplified.

The acyl group usually about 2 to 20 carbon atoms, and, specifically exemplified are an acetyl group, propionyl group, butyryl group, isobutyryl group, pivaloyl group, benzoyl group, trifluoroacetyl group, pentafluoro benzoyl, etc.

The acyloxy group usually has about 2 to 20 carbon atoms and, specifically exemplifeid are acetoxy group, propionyloxy group, butyryloxy group, isobutyryloxy group, pivaloyloxy group, benzoyloxy group, trifluoroacetyloxy group, pentafluorobenzoyl oxy group, etc.

The imino group has about 2 to 20 carbon atoms, and, specifically exemplified are a group shown by the following structural formula, etc.

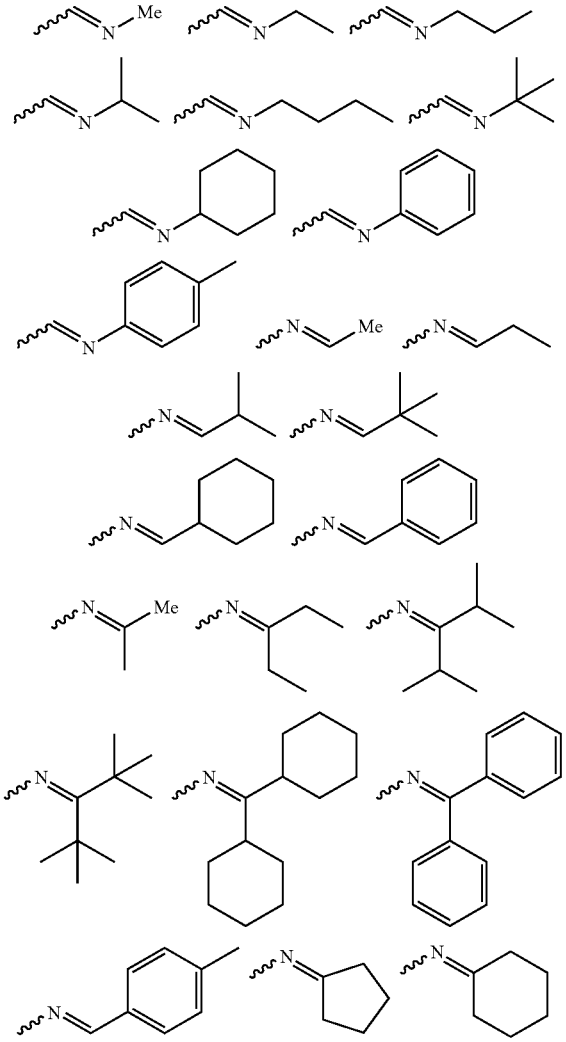

The amide group usually has about 1 to 20 carbon atoms, and, specifically exemplified are formamide group (carbon atom is 1), acetamide group, propioamide group, butyroamide group, benzamide group, trifluoro acetamide group, pentafluoro benzamide group, diformamide group, diacetoamide group, dipropioamide group, dibutyroamide group, dibenzamide group, ditrifluoroacetamide group, dipentafluorobenzamide group, etc.

The imide group usually has about 2 to 60 carbon atoms, and exemplified are groups specifically shown below.

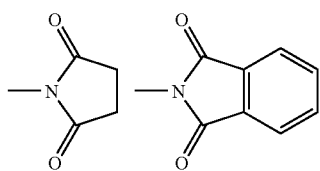

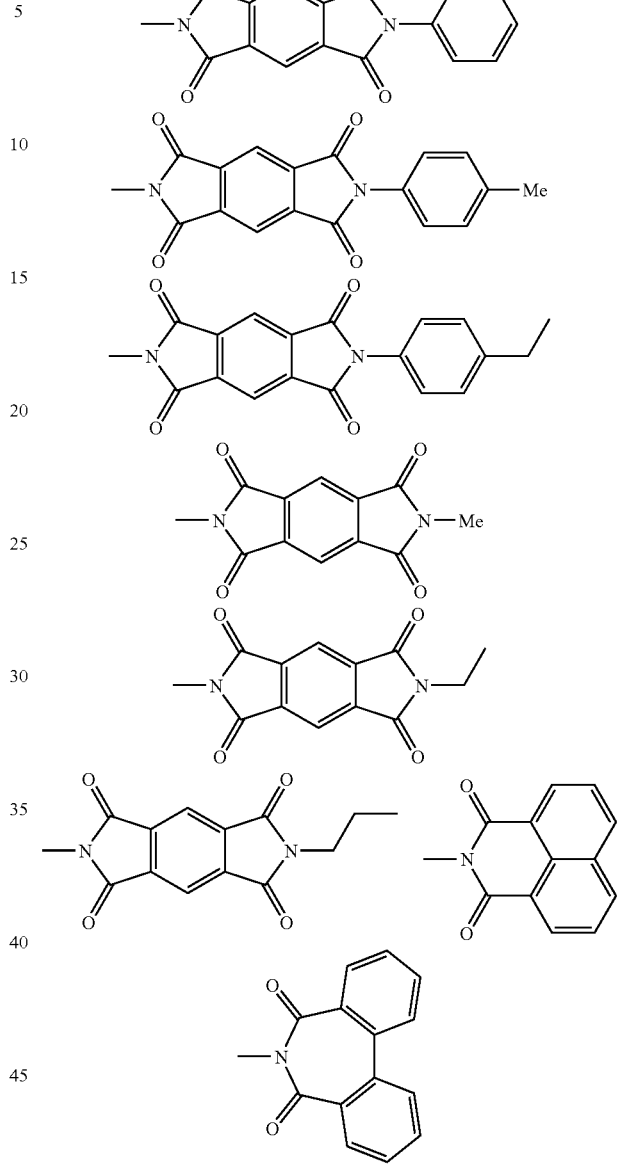

The monovalent heterocyclic group means an atomic group in which a hydrogen atom is removed from a heterocyclic compound, and usually has about 4 to 60 carbon atoms, preferably 4 to 20. The carbon atoms of the substituent are not counted as the number of carbon atoms of the heterocyclic group. The heterocyclic compound means an organic compound having a cyclic structure in which at least one heteroatom such as oxygen, sulfur, nitrogen, phosphorus, boron, etc. is contained in the cyclic structure as the element other than carbon atoms. Specific examples thereof include a thienyl group, $C_1$–$C_{12}$ alkylthienyl group, pyroryl group, furyl group, pyridyl group, $C_1$–$C_{12}$ alkylpyridyl group, piperidyl group, quinolyl group, isoquinolyl group, etc. A thienyl group, $C_1$–$C_{12}$ alkylthienyl group, pyridyl group, and $C_1$–$C_{12}$ alkyl pyridyl group are preferable.

The substituted carboxyl group usually has about 2 to 60 carbon atoms, and includes carboxyl groups having substituents of alkyl group, aryl group, arylalkyl group, or a monovalent heterocyclic group. Examples thereof include a methoxycarbonyl group, ethoxycarbonyl group, propoxycarbonyl group, i-propoxycarbonyl group, butoxycarbonyl group, i-butoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl group, 3,7-dimethyl octyloxycarbonyl group, dodecyloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphtoxycarbonyl group, pyridyloxycarbonyl group, etc. The alkyl group, aryl group, arylalkyl group, or monovalent heterocyclic group may have a substituent. The carbon atoms of the substituent are not counted as the carbon number of the substituted carboxyl group.

In the above examples of substituents, the substituent containing an alkyl chain may be linear, branched or cyclic one, or the combination thereof. As the alkyl chain which is not linear, exemplified are isoamyl group, 2-ethylhexyl group, 3,7-dimethyloctyl group, cyclohexyl group, 4-$C_1$–$C_{12}$ alkylcyclohexyl group, etc. Moreover, two alkyl chain ends may be connected to form a ring. Furthermore, methyl or ethyl as a part of said alkyl chain may be replaced by a group containing a hetero atom, or a methyl or ethyl group which is substituted with one or more fluorine atoms. Here, as the hetero atom, an oxygen atom, a sulfur atom, a nitrogen atom, etc. are exemplified.

Furthermore, in the examples of substituents containing an aryl group or a heterocyclic group, they may have one or more substituents.

$X_1$, $X_2$ and $X_3$ in the monomer shown by formulas (12) and (13) which are used for the block copolymer of the present invention are each independently an alkylsulfonyloxy group which may be substituted by a halogen atom or fluorine atom; an aryl sulfonyloxy group which may be substituted by an alkyl group; boric acid, or boric ester (at least one is an alkylsulfonyloxy group which may be substituted by a halogen atom or fluorine atom; or an aryl sulfonyloxy group which may be substituted by an alkyl group). Here, it is preferable that $Y_1$ in a monomer represented by formula (13), and $Y_2$ and $Y_3$ in a monomer represented by formula (14) are each independently an aldehyde group, a carbonyl group, phosphonate, or a phosphonium salt (wherein, at least one is an aldehyde group or a carbonyl group).

Moreover, $X_1$, $X_2$ and $X_3$ in the monomer shown by formulas (12) and (13) which are used for the block copolymer of the present invention are each independently an aldehyde group, a carbonyl group, phosphonate, or a phosphonium salt (wherein, at least one is an aldehyde group or a carbonyl group). Here, it is preferable that $Y_1$ in a monomer represented by formula (13), and $Y_2$ and $Y_3$ in a monomer represented by formula (14) are each independently an alkylsulfonyloxy group which may be substituted by a halogen atom or fluorine atom; an aryl sulfonyloxy group which may be substituted by an alkyl group; boric acid, or boric ester (at least one is an alkylsulfonyloxy group which may be substituted by a halogen atom or fluorine atom; or an aryl sulfonyloxy group which may be substituted by an alkyl group).

Moreover, as the process for producing the block copolymer of the present invention, it is preferable that, among the groups selected from $X_1$, $X_2$, and $X_3$ in a monomer represented by general formulas (12) and (13), one or more of the groups are boric acid or boric ester, one or more of the groups are a halogen atom, an alkylsulfonyloxy group which may be substituted by a fluorine atom, or an aryl sulfonyloxy group which may be substituted by an alkyl group; $Y_1$ in a monomer represented by general formula (13) is a reactive group selected from an aldehyde group, carbonyl group, phosphonate group or phosphonium salt; and by reaction under the existence of Pd(0) catalyst, an initial polymer having an aldehyde group, carbonyl group, phosphonate group, or phosphonium salt at the terminal is obtained.

Moreover, as the process for producing the block copolymer of the present invention, it is preferable that, $X_1$, $X_2$, and $X_3$ in a monomer represented by general formulas (12) and (13), are a halogen atom, an alkylsulfonyloxy group which may be substituted by a fluorine atom, or an aryl sulfonyloxy group which may be substituted by an alkyl group; $Y_1$ in a monomer represented by general formula (13) is a reactive group selected from an aldehyde group, carbonyl group, phosphonate group or phosphonium salt; and by reaction under the existence of Ni(0), an initial polymer having an aldehyde group, carbonyl group, phosphonate group, or phosphonium salt at the terminal is obtained.

As for the obtained initial polymers, in case of the combination of those having an aldehyde group and/or carbonyl group at the terminal, a block copolymer having a double bond can be obtained by the reductive reaction under existence of low valence titanium, etc.

Similarly, when $Y_2$ and $Y_3$ in the monomer shown by general formula (14) are an aldehyde group and/or a carbonyl group, a block copolymer having a double bond can be obtained by the reaction with the initial polymer.

Moreover, in case of the combination of that having an aldehyde group and/or a carbonyl group and that having a phosphonate group and/or a phosphonium salt at the terminal, a block copolymer having a double bond can be obtained by the reaction under existence of a base.

Similarly, when $Y_2$ and $Y_3$ in the monomer shown by general formula (14) are an aldehyde group and/or a carbonyl group, and a phosphonate group and/or a phosphonium salt, a block copolymer having a double bond can be obtained by the reaction with the initial polymer.

Moreover, as the process for producing the block copolymer of the present invention, it is more preferable that, one or more of $X_1$, $X_2$, and $X_3$ in a monomer shown by of general formulas (12) and (13) are an aldehyde group or a carbonyl group, one or more of them are phosphonate or a phosphonium salt, $Y_1$ in a monomer shown by general formula (13) is a reaction active group selected from a halogen atom, an alkylsulfonyloxy group which may be substituted by a fluorine atom, and an arylsulfonyloxy group which may be substituted by an alkyl group; and by reaction under the existence of a base, an initial polymer having a halogen atom, an alkylsulfonyloxy group which may be substituted by a fluorine atom, and an arylsulfonyloxy group which may be substituted by an alkyl group at the terminal is obtained.

As for the obtained initial polymer having a halogen atom, an alkylsulfonyloxy group which may be substituted by a fluorine atom, and an arylsulfonyloxy group which may be substituted by an alkyl group at the terminal, a block copolymer having an aryl-aryl bond can be obtained by the reaction under existence of Ni(0).

Similarly, in the case that $Y_2$ and $Y_3$ in a monomer shown by general formula (14) are a halogen atom, an alkylsulfonyloxy group which may be substituted by a fluorine atom, and an arylsulfonyloxy group which may be substituted by an alkyl group, a block copolymer having an aryl-aryl bond can be obtained by the reaction with the initial polymer.

In the above process, a mixture containing a block copolymer is obtained according to the combination. For example, when an initial polymer (a below formula (16), (17)) having different repetition structure is used, $$Y_1-F-Y_1 \quad (16)$$

$$Y_1\text{-}G\text{-}Y_2 \quad (17)$$

a polymer obtained by reacting these is, in case of having a junction unit, a mixture of
-F-block-(B)-block-G-
-F-block-(B)-block-F-
-G-block-(B)-block-G- is obtained. In case of not having a junction unit, a mixture of
-F-block-G-
-F-block-F-
-G-block-G- is obtained.

This is the same also with the process which uses the initial polymer and the monomer shown by general formula (14).

As the halogen atom, chlorine atom, bromine atom and iodine atom are exemplified. Chlorine atom and bromine atom are preferable, and bromine atom is more preferable.

As the alkylsulfonyloxy group which may be substituted by a fluorine atom, trifluoromethane sulfonyloxy group is exemplified, and as the arylsulfonyloxy group which may be substituted by an alkyl group, phenylsulfonyloxy group and tolylsulfonyloxy group are exemplified.

In the above process, the method for synthesizing the initial polymer is not especially limited so long that group $(Y_1)$ is not decomposed at the time of synthesis, and methods of known references can be used for it.

Moreover, in the above process, as a method of reaction of initial polymers themselves or an initial polymer with a monomer (III) having two reactive groups in a molecule, which can react with the reactive group $(Y_2, Y_3)$, it is not especially limited, but methods of below references can be used.

Preferably, Wittig reaction, Horner reaction, McMurry reaction, Suzuki reaction, an aryl-aryl coupling reaction using Ni(0), etc. are exemplified.

Moreover, it is also possible to protect a reactive group $(Y_1)$ with a suitable protective group according to necessity, and to remove the protection after obtaining an initial polymer to use for the production.

As the known references, exemplified are: Organic Reactions, vol. 14, p. 270–490, John Wiley&Sons, Inc., 1965; Organic Reactions, vol. 27, p. 345–390, John Wiley&Sons, Inc., 1982; Organic Syntheses, Collective Volume VI, p. 407–411, John Wiley&Sons, Inc., 1988; Chem. Rev., vol. 95, p. 2457 (1995); J. Organomet. Chem., vol. 576, p. 147(1999); J. Prakt. Chem., vol. 336, p. 247 (1994); Makromol. Chem., Macromol. Symp., vol. 12, p. 229, pages (1987), etc.

It is preferable that the organic solvent used is subjected to a deoxygenation treatment sufficiently and the reaction is progressed under an inert atmosphere, generally for suppressing a side reaction, though the treatment differs depending on compounds and reactions used. Further, it is preferable to conduct a dehydration treatment likewise (however, this is not applicable in the case of a reaction in a two-phase system with water, such as a Suzuki coupling reaction).

The reaction conditions are described in detail.

In case of Wittig reaction, Horner reaction, etc., the reaction is conducted using an alkali in an equivalent amount or more, preferably 1 to 3 equivalent to the functional group of a monomer. As the alkali, without being limited, metal alcoholates, such as potassium-t-butoxide, sodium-t-butoxide, sodium ethylate, and lithium methylate; hydride reagents, such as sodium hydride; and amide, such as sodium amide, can be used. As the solvent, N,N-dimethylformamide, tetrahydrofuran, dioxane, toluene, etc. are used. The reaction temperature is usually from room temperature to about 150° C. to proceed the reaction.

The reaction time, for example, is 5 minutes to 10 hours, but it is enough so that the reaction proceed sufficiently. As it is not necessary to leave it for a long time after the reaction, it is preferably 10 minutes to 24 hours.

The concentration in the reaction, if it is too diluted, the efficiency of reaction is low, and if it is too concetrated, the reaction control become difficult, and it is appropriately chosen between about 0.01 wt % to the maximum soluble concentration, and usually it is in a range of 0.1 wt %–20 wt %.

In case of Suzuki coupling reaction, as the catalyst, for example, palladium [tetrakis(triphenyl phosphine)] and palladium acetate etc. are used for the reaction with adding inorganic bases, such as potassium carbonate, sodium carbonate, and barium hydroxide; organic bases, such as a triethylamine; and inorganic salts, such as cesium fluoride, in equivalent amount, preferably 1 to 10 equivalent based on the monomer. The reaction may be performed in 2 phase system, using an inorganic salt in an aqueous solution. As the solvent, N,N-dimethylformamide, toluene, dimethoxy ethane, tetrahydrofuran, etc. are exemplified. The temperature depends on a solvent, but it is preferably about 50–160° C. The temperature may be raised to around the boiling point to reflux. The reaction time is about 1 hour to 200 hours.

The case where a zero-valent nickel complex is used is explained. As the nickel complex, there are a method using zero-valent nickel itself and a method reacting a nickel salt under existence of a reducing agent to generate a zero-valent nickel in the system, and to use it for reaction.

As the zero-valent nickel complex, bis(1,5-cyclo octadiene)nickel(0), (ethylene)bis(triphenylphosphine) nickel(0), tetrakis(triphenylphosphine)nickel etc. are exemplified, and among them, bis(1,5-cyclooctadiene) nickel(0) is preferable in the viewpoint that it is versatile and cheap.

Moreover, it is preferable to add a neutral ligand in view of improvement of the yield.

The neutral ligand is a ligand which has neither an anion nor a cation, and exemplified are:

nitrogen-containing ligands, such as 2,2'-bipyridyl, 1,10-phenanthroline, methylene bisoxazoline, and N,N'-tetramethylethylenediamine;

tertiary phosphine ligands, such as triphenyl phosphine, tritolyl phosphine, tributyl phosphine, and triphenoxy phosphine, etc. A nitrogen-containing ligand is preferable in view of versatility and cheapness. 2,2'-bipyridyl is especially preferable in view of high reactivity and high yield.

Especially, it is preferable that 2,2'-bipyridyl is added as a neutral ligand to a bis(1,5-cyclooctadiene) nickel(0) containing system in view of improvement of polymer yield.

In the method of reacting a zero-valent nickel in the system, nickel-chloride and nickel acetate etc. are exemplified as a nickel salt. As a reducing agent, zinc, sodium hydride, hydrazine and its derivative, lithium aluminum hydride, etc. are exemplified, and as an additive, ammonium iodide, lithium iodide, potassium iodide, etc. are used according to requirements.

As a polymerization solvent, it is not specially limited so long that the polymerization is not inhibited, those containing one or more kinds of aromatic-hydrocarbon solvents and/or ether solvents are preferable.

The aromatic hydrocarbon solvent is a solvent consisting of an aromatic hydrocarbon compound, and includes for example, benzene, toluene, xylene, trimethylbenzene, tetramethylbenzene, butylbenzene, naphthalene, tetralin, etc., and toluene, xylene, tetralin, and tetramethylbenzene are preferable.

The ether solvent is a solvent consisting of a compound in which hydrocarbon groups are bonded by an oxygen atom, and includes for example, diisopropyl ether, tetrahydrofuran, 1,4-dioxane, diphenyl ether, ethylene glycol, dimethyl ether, tert-butylmethylether, etc., and tetrahydrofuran and 1,4-dioxane, etc. are preferable, which are good solvents to a polymeric fluorescent substance.

In view of improving polymerization property and solubility, as the solvent, an aromatic hydrocarbon solvent and/or an ether solvent, and a mixed solvent of an aromatic-hydrocarbon solvent and a solvent other than an ether solvent, as long as it does not inhibit the polymerization reaction.

The reaction operation etc. can be performed according to the methods described, for example, in JP-A 2000-44544.

In the present invention, for example, polymerization reaction is usually performed under an inert gas atmosphere, such as argon and nitrogen, in tetrahydrofuran solvent, at 60° C., under existence of a zero-valent nickel complex and a neutral ligand.

The polymerization time is usually about 0.5–100 hours, and in view of the manufacture cost, it is preferably 10 hours or less.

The polymerization temperature is usually about 0–200° C., and in view of high yield and low heating cost, it is preferably 20–100° C.

After reaction, although it may be used for the next reaction as it is, but the polymer may be also treated by conventional separation operations or purification operations; such acid washing, alkali washing, neutralization, water washing, organic-solvent washing, reprecipitation, centrifugal separation, extraction, and column chromatography; and drying operation, or other operations, after polymerization, according to requirements. In view of the improvement in a yield of the succeeding reaction, it is more preferable to conduct separation operation, purification operation, and drying. Moreover, when using as a light-emitting material of polymer LED, since luminescence from a thin film is used, those exhibiting fluorescence in the solid state are used preferably, as the polymeric fluorescent substance.

As a good solvent for the polymeric fluorescent substance, chloroform, methylene chloride, dichloroethane, tetrahydrofuran, toluene, xylene, mesitylene, decalin, n-butylbenzene, dioxane, etc. are exemplified. Although it depends also on the structure and the molecular weight of a polymeric fluorescent substance, it is usually dissolved in 0.1% by weight or more, in the solvents.

The polymeric fluorescent substance composition of the present invention is characterized by comprising a block copolymer of the present invention. The amount of the block copolymer is usually 10% by weight or more based on the whole polymeric fluorescent substance composition.

Next, the polymer LED of the present invention will be described. The polymer LED of the present invention is a polymer light emitting diode, comprising at least a light-emitting layer between electrodes consisting of an anode and a cathode, and the copolymer or the polymer composition of the present invention is contained in the light-emitting layer.

As the polymer LED of the present invention, there are exemplified polymer LEDs comprising an electron transporting layer disposed between a cathode and a light emitting layer, polymer LEDs comprising a hole transporting layer disposed between an anode and a light emitting layer, polymer LEDs comprising an electron transporting layer disposed between a cathode and a light emitting layer and having a hole transporting layer disposed between an anode and a light emitting layer.

As the polymer LED of the present invention, also included are polymer LEDs comprising a layer containing a conductive polymer disposed at least between one electrode and a light emitting layer such that the layer containing a conductive polymer is adjacent to the electrode; and polymer LEDs comprising an insulation layer having a thickness of 2 nm or less disposed at least between one electrode and a light emitting layer such that the insulation layer is adjacent to the electrode.

For example, the following structures a) to d) are specifically exemplified.

a) anode/light emitting layer/cathode b) anode/hole transporting layer/light emitting layer/cathode c) anode/light emitting layer/electron transporting layer/cathode d) anode/hole transporting layer/light emitting layer/electron transporting layer/cathode (wherein, "/" indicates adjacent lamination of layers. Hereinafter, the same).

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer. The light emitting layer, hole transporting layer and electron transporting layer may also each independently used in two or more layers.

Of charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode f) anode/light emitting layer/charge injecting layer/cathode g) anode/charge injecting layer/light emitting layer/charge injecting layer/cathode h) anode/charge injecting layer/hole transporting layer/light emitting layer/cathode i) anode/hole transporting layer/light emitting layer/charge injecting layer/cathode j) anode/charge injecting layer/hole transporting layer/light emitting layer/charge injecting layer/cathode k) anode/charge injecting layer/light emitting layer/electron transporting layer/cathode l) anode/light emitting layer/electron transporting layer/charge injecting layer/cathode m) anode/charge injecting layer/light emitting layer/electron transporting layer/charge injecting layer/cathode n) anode/charge injecting layer/hole transporting layer/light emitting layer/electron transporting layer/cathode o) anode/hole transporting layer/light emitting layer/electron transporting layer/charge injecting layer/cathode p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or, less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode In producing a polymer LED, when a film is formed from a solution by using such polymeric fluorescent substance soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 µm, preferably from 2 nm to 500 nm, further preferably from 5 nm to 200 nm.

In the polymer LED of the present invention, light emitting materials other than the above-described polymeric fluorescent substance can also be mixed in a light emitting layer. Further, in the polymer LED of the present invention, the light emitting layer containing light emitting materials other than the above-described polymeric fluorescent substance may also be laminated with a light emitting layer containing the above-described polymeric fluorescent substance.

As the light emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 μm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used.

As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 µm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that the anode of an electrode consisting of an anode and a cathode is transparent or semitransparent.

As the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium.tin.oxide (ITO), indium.zinc.oxide and the like,which are metal oxide complexes, and gold, platinum, silver, copper and the like are used, and among them, ITO, indium.zinc.oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 µm, preferably from 20 nm to 1 µm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 µm, preferably from 20 nm to 1 µm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

The polymer LED of the present invention can be used for a flat light source, a segment display, a dot matrix display, and a liquid crystal display as a back light, etc. For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

Moreover, the block copolymer of the present invention can be used also for coloring matter for lasers, organic solar-battery materials, organic semiconductors for organic transistor, and conductive thin-film materials such as a conductive thin film, and an organic-semiconductor thin film.

The following examples further illustrate the present invention in detail but do not limit the scope thereof.

Here, regarding the weight-average molecular weight and number-average molecular weight, the polystyrene reduced number average molecular weight was determined by gel permeation chromatography (GPC) using chloroform as a solvent.

EXAMPLE 1

<Synthesis of Initial Polymer (1)>

2.7 g of 9,9-dioctyl-2,7-dibromofluorene, 2.3 g of 4-bromo-2,5-(3,7-dimethyloctyloxy)benzaldehyde and 2.7 of 2,2'-bipyridyl were charged into a reaction container, and the inside of the reaction system was replaced with argon. Tetrahydrofuran (dehydrated solvent) 150 ml which was deaerated beforehand by bubbling with argon gas was added to this.

Next, bis(1,5-cyclooctadiene)nickel (0) 5.0 g was added to this mixed solution, stirred for 10 minutes at a room temperature, and then reacted at 60° C. for 7 hours. Here, the reaction was performed in an argon gas atmosphere. After the reaction, this solution was cooled, and then poured into a mixed solution of 25% aqueous-ammonia 50 ml/methanol 200 ml/ ion-exchanged water 150 ml, and stirred for about 1 hour. Next, the resulting precipitate was filtrated and collected. The precipitate was dried and then dissolved in chloroform. After having filtrated this solution to remove insoluble matters, this solution was poured into methanol for reprecipitation and the resulting precipitate was collected. This precipitate was dried under reduced pressure, and initial polymer (1) 1.4 g was obtained.

The polystyrene reduced weight average molecular weight of resulting initial polymer (1) was $6.1 \times 10^4$, and the number average molecular weight was $2.4 \times 10^4$.

The structure of initial polymer (1) expected from the charging ratio of the monomers is as follows.

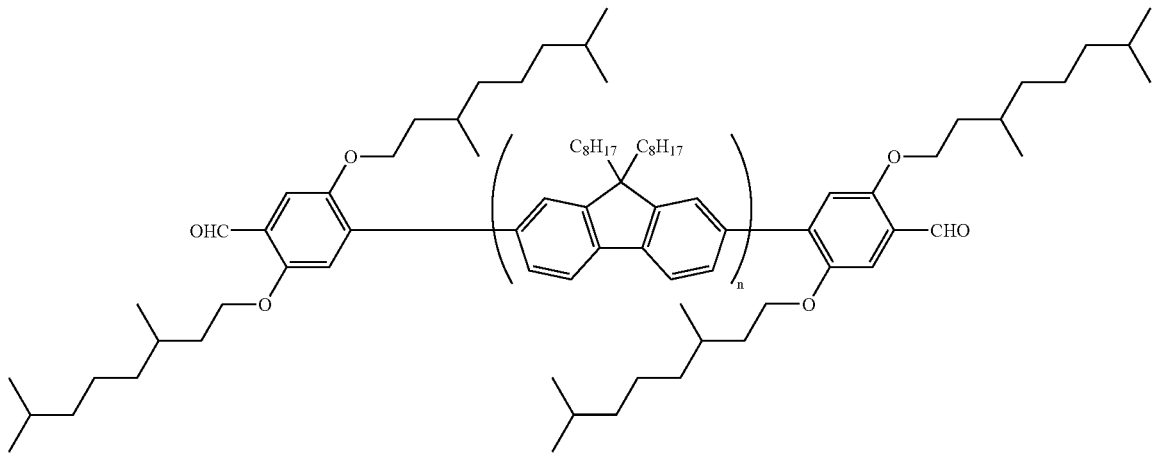

<Synthesis of Polymeric Fluorescent Substance 1>

0.016 g of phosphonate obtained by reacting 2-methoxy-5-(2-ethylhexyloxy)-p-xylylene dichloride and triethyl phosphite, and 0.5 g of the above initial polymer (1) were charged into a reaction container, and the inside of reaction system was replaced by argon gas. Tetrahydrofuran (dehydrated solvent) 50 ml which was deaerated beforehand by bubbling with argon gas was added to this. Next, to this solution, a solution of potassium-tert.-butoxide 0.07 g dissolved in 5 ml of deaerated tetrahydrofuran (dehydrated solvent) was added dropwise at a room temperature for about 10 minutes. It was reacted at a room temperature successively for 2.5 hours.

After the reaction, after having added acetic acid and neutralizing, this solution was poured into methanol and stirred for about 1 hour. Next, resulting precipitate was filtrated and collected. After drying this precipitate under reduced pressure, 0.46 g of a polymer was obtained. The resulting polymer is referred to as polymeric fluorescent substance 1.

The polystyrene reduced weight average molecular weight of polymeric fluorescent substance 1 was $9.6 \times 10^4$, and the number average molecular weight was $3.7 \times 10^4$.

The structure of polymeric fluorescent substance 1 expected from the charging ratio of the monomers is as follows. As a result of measuring the fluorescence spectrum of the thin film of the resulting polymeric fluorescent substance 1 by a method described in example 9, the peak wavelength of fluorescence was 504 nm.

this solution was cooled, and then poured into a mixed solution of 25% aqueous-ammonia 50 ml/methanol 200 ml/ion-exchanged water 150 ml, and stirred for about 1 hour. Next, the resulting precipitate was filtrated and collected. The precipitate was dried and then dissolved in chloroform. After having filtrated this solution to remove insoluble matters, this solution was poured into methanol for reprecipitation and the resulting precipitate was collected. This precipitate was dried under reduced pressure, and initial polymer (2) 1.2 g was obtained.

The polystyrene reduced weight average molecular weight of resulting initial polymer (2) was $2.9 \times 10^4$, and the number average molecular weight was $1.1 \times 10^4$.

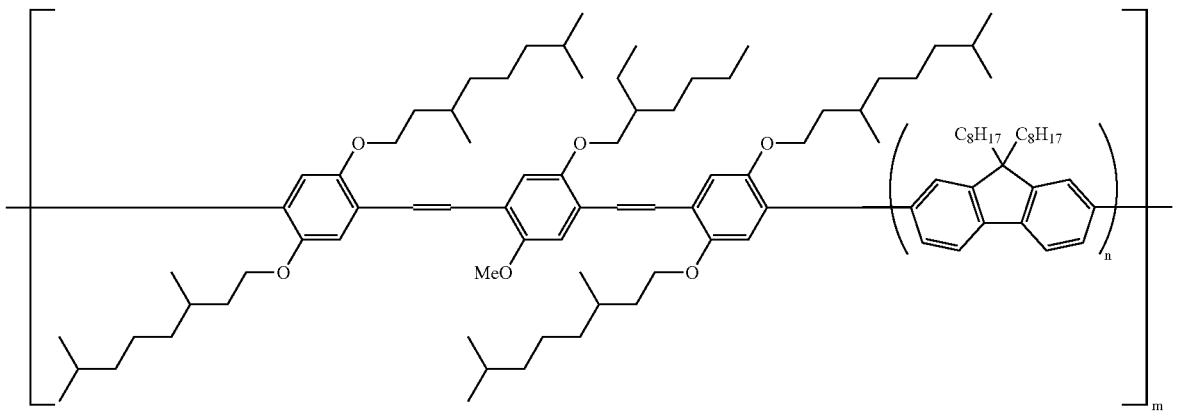

COMPARATIVE EXAMPLE 1

<Synthesis of Polyfluorene>

Poly(9,9-dioctylfluorene-2,7-diyl) was obtained as the same manner with the synthesis of the above polymer (1) except that only 9,9-dioctyl-2,7-dibromo fluorene was used instead of 9,9-dioctyl-2,7-dibromofluorene and 4-bromo-2,5-(3,7-dimethyloctyloxy)benzaldehyde. The polystyrene reduced weight average molecular weight of resulting polyfluorene was $4.4 \times 10^5$, and the number average molecular weight was $1.2 \times 10^5$. As a result of measuring the fluorescence spectrum of the thin film of the resulting polyfluorene by a method described in Example 9, the peak wavelength of fluorescence was 428 nm.

As above, the fluorescence peak wavelength of polymeric fluorescent substance 1 was longer than that of polyfluorene which constitutes the blocks by 76 nm.

EXAMPLE 2

<Synthesis of Initial Polymer (2)>

2.7 g of 9,9-dioctyl-2,7-dibromofluorene, 1.1 g of 3-bromo-p-anisaldehyde and 2.7 of 2,2'-bipyridyl were charged into a reaction container, and the inside of the reaction system was replaced with argon. Tetrahydrofuran (dehydrated solvent) 150 ml which was deaerated beforehand by bubbling with argon gas was added to this. Next, bis(1,5-cyclooctadiene)nickel (0) 5.0 g was added to this mixed solution, stirred for 10 minutes at a room temperature, and then reacted at 60° C. for 7 hours. Here, the reaction was performed in an argon gas atmosphere. After the reaction, The structure of initial polymer (2) expected from the charging ratio of the monomers is as follows.

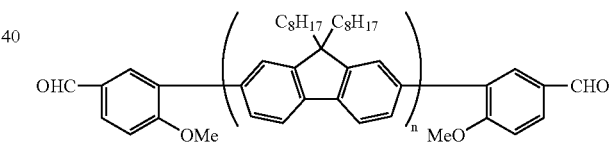

<Synthesis of Polymeric Fluorescent Substance 2>

0.032 g of phosphonate obtained by reacting 2-methoxy-5-(2-ethylhexyloxy)-p-xylylene dichloride and triethyl phosphate, and 0.66 g of the above initial polymer (2) were charged into a reaction container, and the inside of reaction system was replaced by argon gas. Tetrahydrofuran (dehydrated solvent) 30 ml which was deaerated beforehand by bubbling with argon gas was added to this. Next, to this solution, a solution of potassium-tert.-butoxide 0.07 g dissolved in 5 ml of deaerated tetrahydrofuran (dehydrated solvent) was added dropwise at a room temperature for about 10 minutes. It was reacted at a room temperature successively for 2 hours.

After the reaction, after having added acetic acid and neutralizing, this solution was poured into methanol and stirred for about 1 hour. Next, resulting precipitate was filtrated and collected. After drying this precipitate under reduced pressure, 0.6 g of a polymer was obtained. The resulting polymer is referred to as polymeric fluorescent substance 2.

The polystyrene reduced weight average molecular weight of polymeric fluorescent substance 2 was $1.1 \times 10^5$, and the number average molecular weight was $2.7 \times 10^4$.

The structure of polymeric fluorescent substance 2 expected from the charging ratio of the monomers is as follows. As a result of measuring the fluorescence spectrum of the thin film of the resulting polymeric fluorescent substance 2 by a method described in example 9, the peak wavelength of fluorescence was 456 nm.

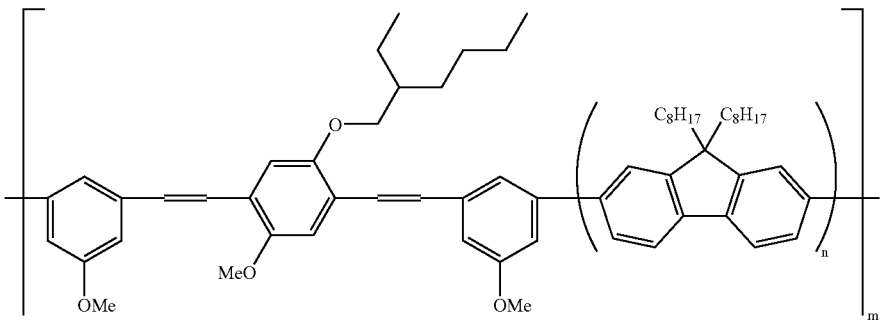

As mentioned above, the fluorescence peak wavelength of polymeric fluorescent substance 2 was longer than that of polyfluorene which constitutes the blocks by 26 nm.

<Synthesis of Initial Polymer (3)>

3.4 g of N,N'-diphenyl-N,N'di(3-methyl-4-bromophenyl)benzidine, 2.3 g of 4-bromo-2,5-(3,7-dimethyloctyloxy)benzaldehyde, and 2.7 of 2,2'-bipyridyl were charged into a reaction container, and the inside of the reaction system was replaced with argon. Tetrahydrofuran (dehydrated solvent) 150 ml which was deaerated beforehand by bubbling with argon gas was added to this. Next, bis(1,5-cyclooctadiene) nickel (0) 5.0 g was added to this mixed solution, stirred for 10 minutes at a room temperature, and then reacted at 60° C. for 7 hours. Here, the reaction was performed in an argon gas atmosphere. After the reaction, this solution was cooled, and then poured into a mixed solution of 25% aqueous-ammonia 50 ml/methanol 200 ml/ion-exchanged water 150 ml, and stirred for about 1 hour. Next, the resulting precipitate was filtrated and collected. The precipitate was dried and then dissolved in chloroform. After having filtrated this solution to remove insoluble matters, this solution was poured into methanol for reprecipitation and the resulting precipitate was collected. This precipitate was dried under reduced pressure, and initial polymer (3) 1.5 g was obtained.

The polystyrene reduced weight average molecular weight of resulting initial polymer (3) was $1.1 \times 10^4$, and the number average molecular weight was $5.8 \times 10^3$.

The structure of initial polymer (3) expected from the charging ratio of the monomers is as follows.

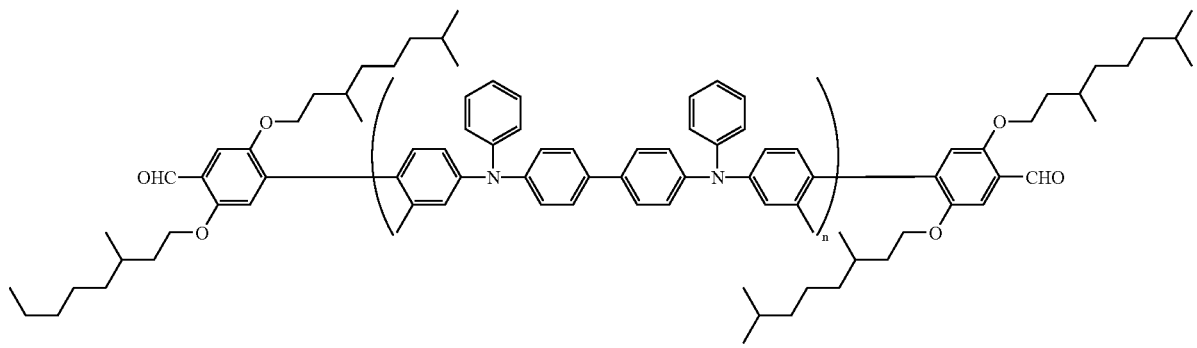

<Synthesis of Initial Polymer (4)>

2.8 g of 9,9-dioctyl-2,7-dibromofluorene, 2.3 g of 4-bromo-2,5-(3,7-dimethyloctyloxy)benzyl phosphonic acid diethyl ester, and 2.7 of 2,2'-bipyridyl were charged into a reaction container, and the inside of the reaction system was replaced with argon. Tetrahydrofuran (dehydrated solvent) 150 ml which was deaerated beforehand by bubbling with argon gas was added to this. Next, bis(1,5-cyclooctadiene)nickel (0) 5.0 g was added to this mixed solution, stirred for 10 minutes at a room temperature, and then reacted at 60° C. for 7 hours. Here, the reaction was performed in an argon gas atmosphere. After the reaction, this solution was cooled, and then poured into a mixed solution of 25% aqueous-ammonia 50 ml/methanol 200 ml/ion-exchanged water 150 ml, and stirred for about 1 hour. Next, the resulting precipitate was filtrated and collected. The precipitate was dried and then dissolved in chloroform. After having filtrated this solution to remove insoluble matters, this solution was poured into methanol for reprecipitation and the resulting precipitate was collected. This precipitate was dried under reduced pressure, and initial polymer (4) 1.1 g was obtained.

The polystyrene reduced weight average molecular weight of resulting initial polymer (4) was $5.0 \times 10^3$, and the number average molecular weight was $4.0 \times 10^3$.

The structure of initial polymer (4) expected from the charging ratio of the monomers is as follows.

wise at a room temperature for about 10 minutes. It was reacted at a room temperature successively for 2.5 hours.

After the reaction, after having added acetic acid and neutralizing, this solution was poured into methanol and stirred for about 1 hour. Next, resulting precipitate was filtrated and collected. After drying this precipitate under reduced pressure, 0.5 g of a polymer was obtained. The resulting polymer is referred to as polymeric fluorescent substance 3.

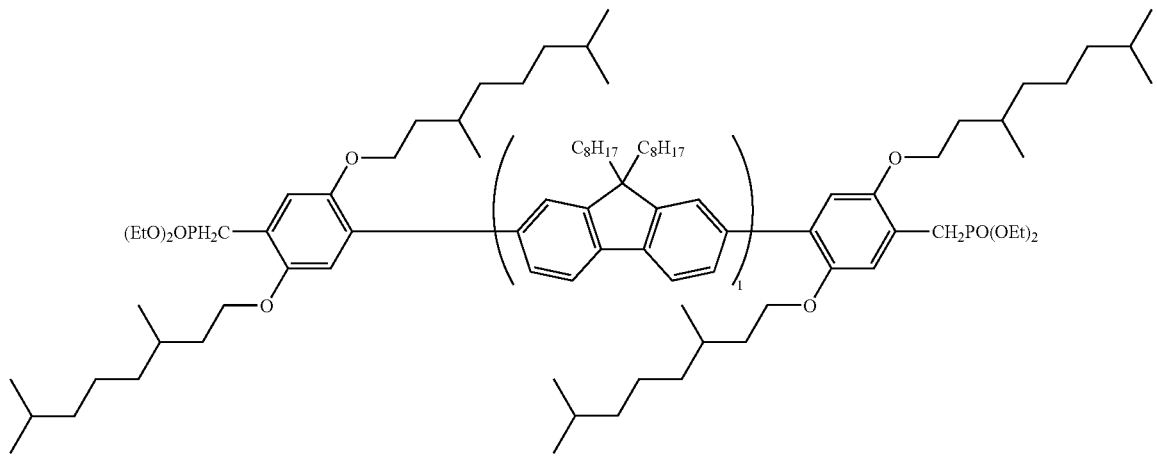

<Synthesis of Polymeric Fluorescent Substance 3>

0.4 g of the above initial polymer (3) and 0.3 g of the above initial polymer (4) were charged into a reaction container, and the inside of reaction system was replaced by argon gas. Tetrahydrofuran (dehydrated solvent) 50 ml which was deaerated beforehand by bubbling with argon gas was added to this. Next, to this solution, a solution of potassium-tert. -butoxide 0.11 g dissolved in 5 ml of deaerated tetrahydrofuran (dehydrated solvent) was added dropwise at a room temperature for about 10 minutes. It was The polystyrene reduced weight average molecular weight of polymeric fluorescent substance 3 was $2.5 \times 10^4$, and the number average molecular weight was $1.0 \times 10^4$.

The structure of polymeric fluorescent substance 3 expected from the charging ratio of the monomers is as follows. As a result of measuring the fluorescence spectrum of the thin film of the resulting polymeric fluorescent substance 3 by a method described in example 11, the peak wavelength of fluorescence was 470 nm.

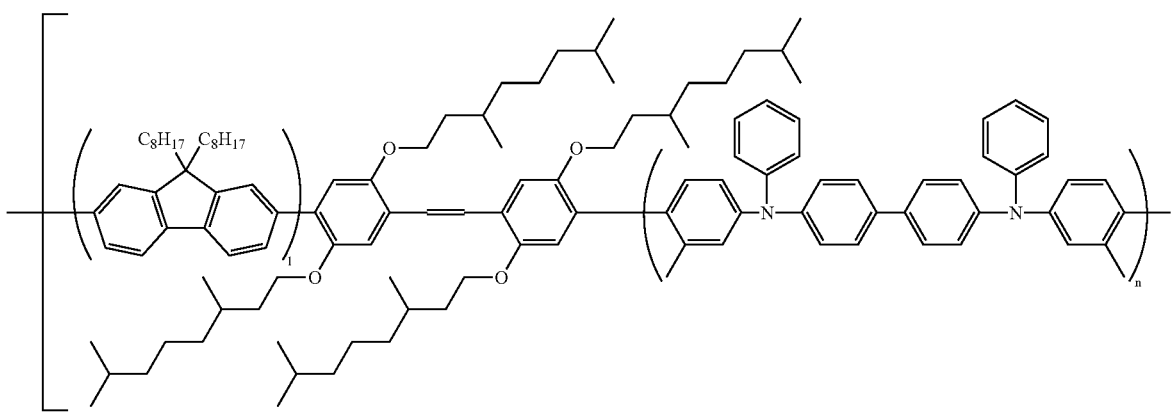

-continued

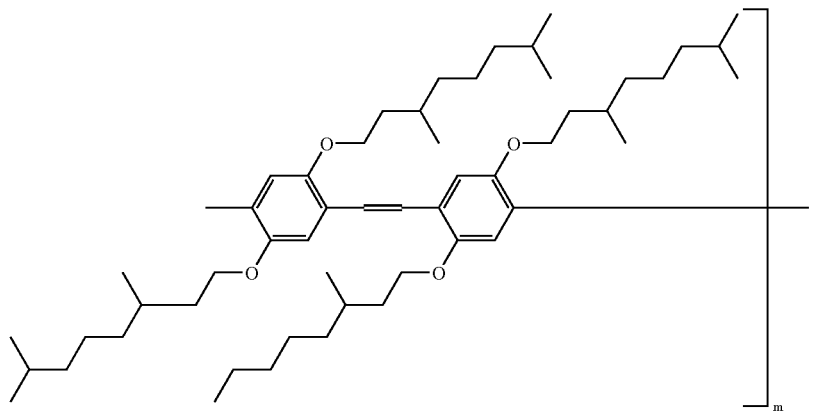

COMPARATIVE EXAMPLE 2

<Synthesis of Referential Polymer 1>

Referential polymer 1 was obtained as the same manner with the synthesis of Example 1 <polymer 1>, except that 2.0 g of N,N'-diphenyl-N,N'-di(3-methyl-4-bromophenyl) benzidine, 1.1 g of 2,2'-bipyridyl, and 2.0 g of bis(1,5-cyclooctadiene)nickel(0) were used as the raw materials, and 0.75 g of referential polymers 1 was obtained. The polystyrene reduced weight average molecular weight of the resulting polymer was $2.8 \times 10^4$, and the number average molecular weight was $1.8 \times 10^4$.

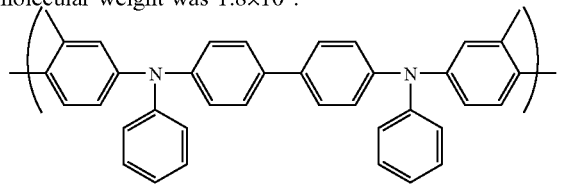

As a result of measuring the fluorescence spectrum of the thin film of the resulting referential polymer 1 by a method described in Example 9, the peak wavelength of fluorescence was 422 nm.

As mentioned above, the fluorescence peak wavelength of a polymeric fluorescent substance 3 was longer than that of polyfluorene which constitutes the blocks by 42 nm, and longer that that of referential polymer 1 by 48 nm.

EXAMPLE 4

<Synthesis of Initial Polymer (5)>

3.0 g of phosphonate obtained by by reacting 2,5-bis (chloro methyl)-4'-(3,7-dimethyloctyloxy)biphenyl and tri-ethyl phosphate, 0.6 g of terephthalaldehyde, and 0.28 g of 4-bromo benzaldehyde were charged into a reaction container, and the inside of reaction system was replaced with argon gas.

Tetrahydrofuran (dehydrated solvent) 40 ml which was deaerated beforehand by bubbling with argon gas was added to this. Next, to this solution, a solution of potassium-tert.-butoxide 2.2 g dissolved in 10 ml of deaerated tetrahydrofuran (dehydrated solvent) was added dropwise at a room temperature for about 20 minutes. It was reacted at a room temperature successively for 3 hours.

After the reaction, after having added acetic acid and neutralizing, this solution was poured into methanol and stirred for about 1 hour. Next, resulting precipitate was filtrated and collected. After drying this precipitate under reduced pressure, 2.8 g of a polymer was obtained. The resulting polymer is referred to as initial polymer (5).

The polystyrene reduced weight average molecular weight of initial polymer (5) was $5.1 \times 10^3$, and the number average molecular weight was $1.8 \times 10^3$.

The structure of initial polymer (5) expected from the charging ratio of the monomers is as follows.

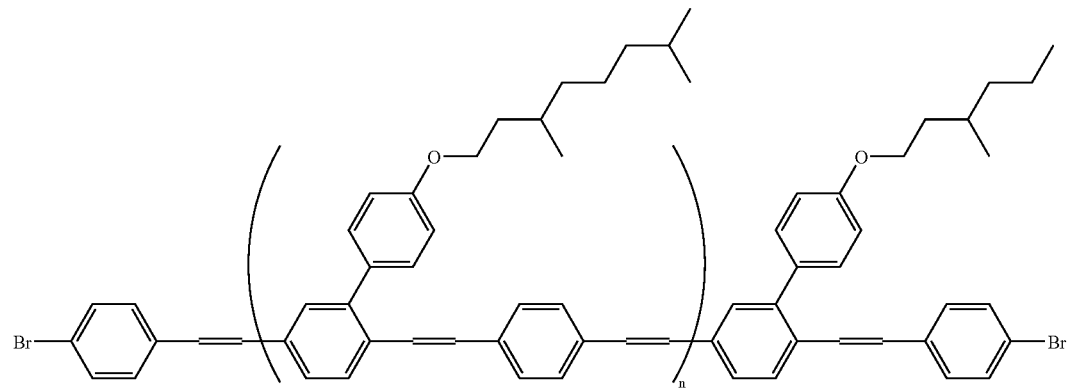

<Synthesis of Polymeric Fluorescent Substance 4>

2.1 g of 9,9-dioctyl-2,7-dibromofluorene, 0.25 g of initial polymer (5), and 1.37 g of 2,2'-bipyridyl were charged into a reaction container, and the inside of the reaction system was replaced with argon. Tetrahydrofuran (dehydrated solvent) 100 ml which was deaerated beforehand by bubbling with argon gas was added to this. Next, bis(1,5-cyclooctadiene)nickel (0) 2.5 g was added to this mixed solution, stirred for 10 minutes at a room temperature, and then reacted at 60° C. for 7 hours. Here, the reaction was performed in an argon gas atmosphere. After the reaction, this solution was cooled, and then poured into a mixed solution of 25% aqueous-ammonia 25 ml/methanol 150 ml/ion-exchanged water 100 ml, and stirred for about 1 hour. Next, the resulting precipitate was filtrated and collected. The precipitate was dried and then dissolved in chloroform. After having filtrated this solution to remove insoluble matters, this solution was poured into methanol for reprecipitation and the resulting precipitate was collected. This precipitate was dried under reduced pressure, a polymer 1.1 g was obtained. This polymer is referred to as polymeric fluorescent substance 4.

The polystyrene reduced weight average molecular weight of the resulting polymeric fluorescent substance 4 was $2.7 \times 10^5$, and the number average molecular weight was $5.8 \times 10^4$.

The units contained in the structure of polymeric fluorescent substance 4 is expected from monomer charging ratio are represented by the following two structures.

As a result of measuring the fluorescence spectrum of the thin film of resulting polymeric fluorescent substance 4 by a method described in Example 9, the peak wavelength of fluorescence was 510 nm, which was longer than that of poly fluorene which is constituting the blocks of polymeric fluorescent substance 4 by 82 nm.

EXAMPLE 5

<Synthesis of Initial Polymer (6)>

4.8 g of phosphonium salts obtained by reacting 2,5-dioctyloxy-p-xylylene dichloride and triphenyl phosphine, 0.6 g of terephthalaldehyde and 0.28 g of 4-bromobenzaldehyde were charged into a reaction container, and the inside of reaction system was replaced by argon gas. Tetrahydrofuran (dehydrated solvent) 40 ml which was deaerated beforehand by bubbling with argon gas was added to this. Next, to this solution, a solution of potassium-tert.-butoxide 2.0 g dissolved in 10 ml of deaerated tetrahydrofuran (dehydrated solvent) was added dropwise at a room temperature for about 20 minutes. It was reacted at a room temperature successively for 3 hours.

After the reaction, after having added acetic acid and neutralizing, this solution was poured into methanol and stirred for about 1 hour. Next, resulting precipitate was filtrated and collected. After drying this precipitate under reduced pressure, 1.5 g of a polymer was obtained. The resulting polymer is referred to as initial polymer (6).

The polystyrene reduced weight average molecular weight of initial polymer (6) was $4.7 \times 10^3$, and the number average molecular weight was $3.3 \times 10^3$.

The units included in the structure of initial polymer (6) expected from the charging ratio of the monomers is as follows.

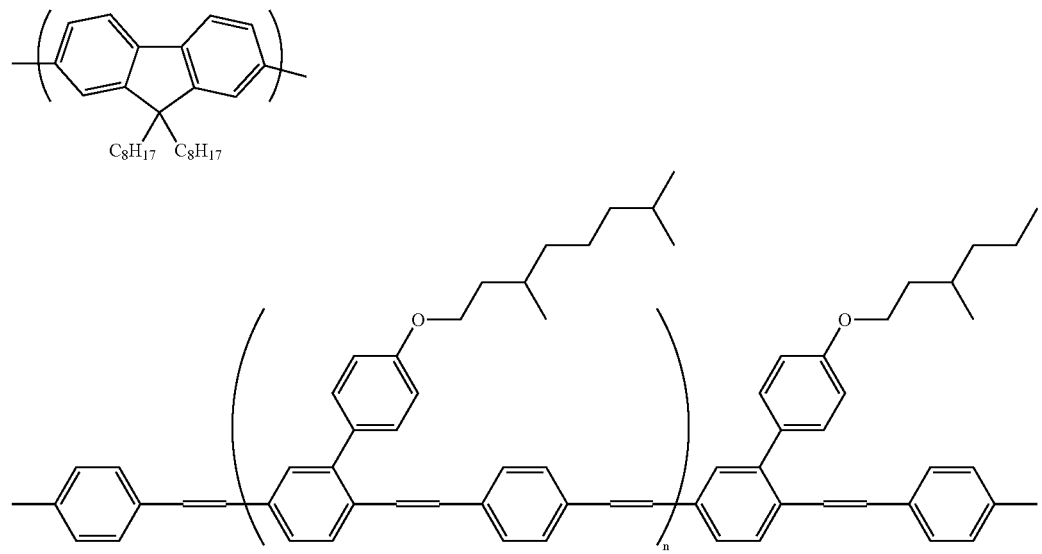

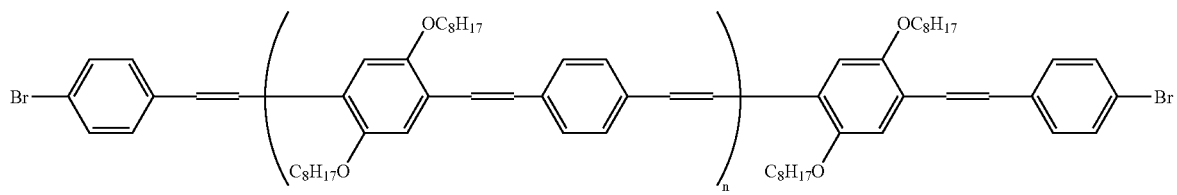

<Synthesis of Polymeric Fluorescent Substance 5>

2.1 g of 9,9-dioctyl-2,7-dibromofluorene, 0.25 g of initial polymer (6), and 1.37 g of 2,2'-bipyridyl were charged into a reaction container, and the inside of the reaction system was replaced with argon. Tetrahydrofuran (dehydrated solvent) 100 ml which was deaerated beforehand by bubbling with argon gas was added to this. Next, bis(1,5-cyclooctadiene)nickel (0) 2.5 g was added to this mixed solution, stirred for 10 minutes at a room temperature, and then reacted at 60° C. for 7 hours. Here, the reaction was performed in an argon gas atmosphere. After the reaction, this solution was cooled, and then poured into a mixed solution of 25% aqueous-ammonia 25 ml/methanol 150 ml/ion-exchanged water 10 ml, and stirred for about 1 hour. Next, the resulting precipitate was filtrated and collected. The precipitate was dried and then dissolved in toluene. After having filtrated this solution to remove insoluble matters, this solution was poured into methanol for reprecipitation and the resulting precipitate was collected. This precipitate was dried under reduced pressure, a polymer 1.0 g was obtained. This polymer is referred to as polymeric fluorescent substance 5.

The polystyrene reduced weight average molecular weight of the resulting polymeric fluorescent substance 5 was $2.4 \times 10^5$, and the number average molecular weight was $6.3 \times 10^4$.

The units contained in the structure of polymeric fluorescent substance 8 is expected from monomer charging ratio is as follows.

As a result of measuring the fluorescence spectrum of the thin film of resulting polymeric fluorescent substance 5 by a method described in Example 9, the peak wavelength of fluorescence was 524 nm, which was longer than that of a poly fluorene which constitutes the blocks of polymeric fluorescent substance 5 by 96 nm.

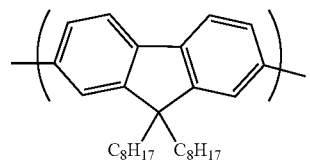

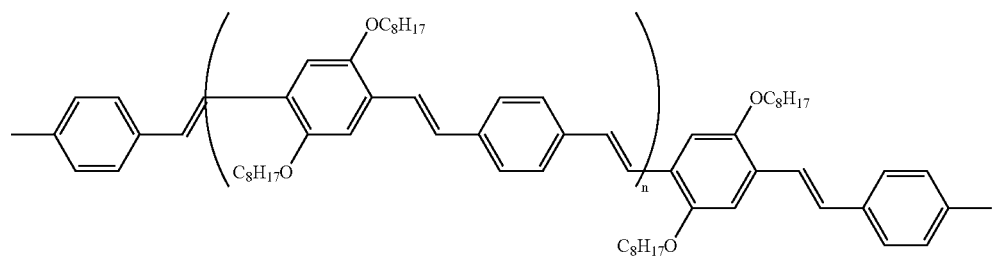

EXAMPLE 6

<Synthesis of Initial Polymer (7)>

1.0 g of initial polymer (7) was obtained as the same manner with the synthesis of Example 1 <polymer 1>, except that 1.64 g of 9,9-dioctyl-2,7-dibromofluorene, 0.42 g of bis (4-bromophenyl)-(4-(4'-tert butyl)styryl)amine, 0.09 g of 4-bromo benzaldehyde, 1.38 g of 2,2'-bipyridyl, and 2.5 g of bis (1,5-cyclooctadiene)nickel(0) were used as the raw materials. The polystyrene reduced weight average molecular weight of the resulting polymer was $9.2 \times 10^4$, and the number average molecular weight was $4.2 \times 10^4$.

The unit contained in the structure of initial polymer (7) expected from monomer charging ratio is as follows.

<Synthesis of Polymeric Fluorescent Substance 6>

0.18 g of polymeric fluorescent substances 6 was obtained as the same manner with the synthesis of Example 3 <polymeric fluorescent substance 3> except that 0.3 g of the above initial polymer (7), 0.08 g of the above initial polymer (8) and 0.1 g of t-butoxy potassium were used as the raw materials. The polystyrene reduced weight average molecular weight of the resulting polymeric fluorescent substance 6 was $9.2 \times 10^4$, and the number average molecular weight was $4.2 \times 10^4$.

The unit included in the structure of the polymeric fluorescent substance 6 expected from charged monomers is as follows.

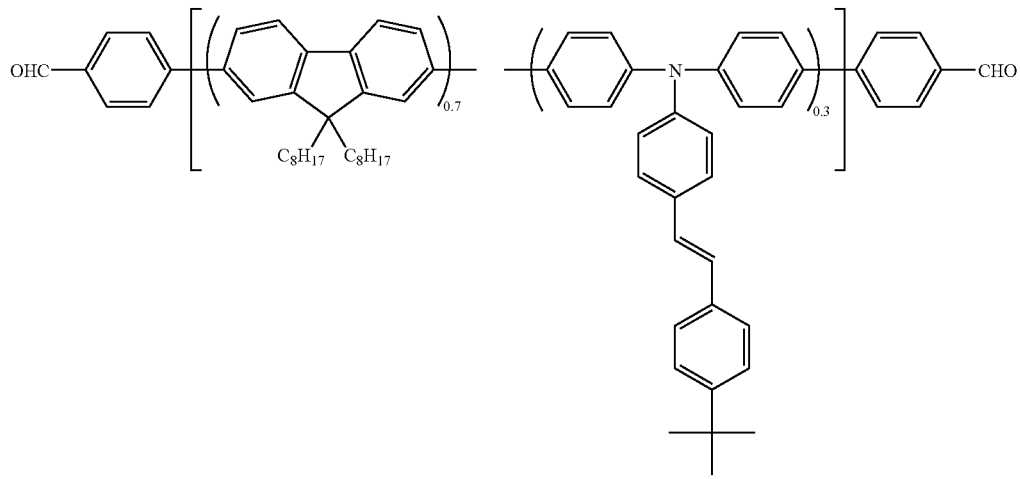

<Synthesis of Initial Polymer (8)>

2.7 g of initial polymer (8) was obtained as the same manner with the synthesis of Example 3 <polymer (4)>, except that 3.6 g of 9,9-dioctyl-2,7-dibromofluorene, 0.61 g of 4-bromobenzyl phosphonic acid diethyl ester, 5.5 g of 2,2'-bipyridyl and 10 g of bis(1,5-cyclooctadiene)nickel(0) were used as the raw materials. The polystyrene reduced weight average molecular weight of the resulting polymer was $2.5 \times 10^4$, and the number average molecular weight was $1.1 \times 10^4$.

The unit contained in the structure of initial polymer (8) expected from monomer charging ratio is as follows.

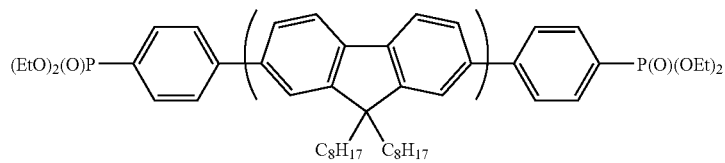

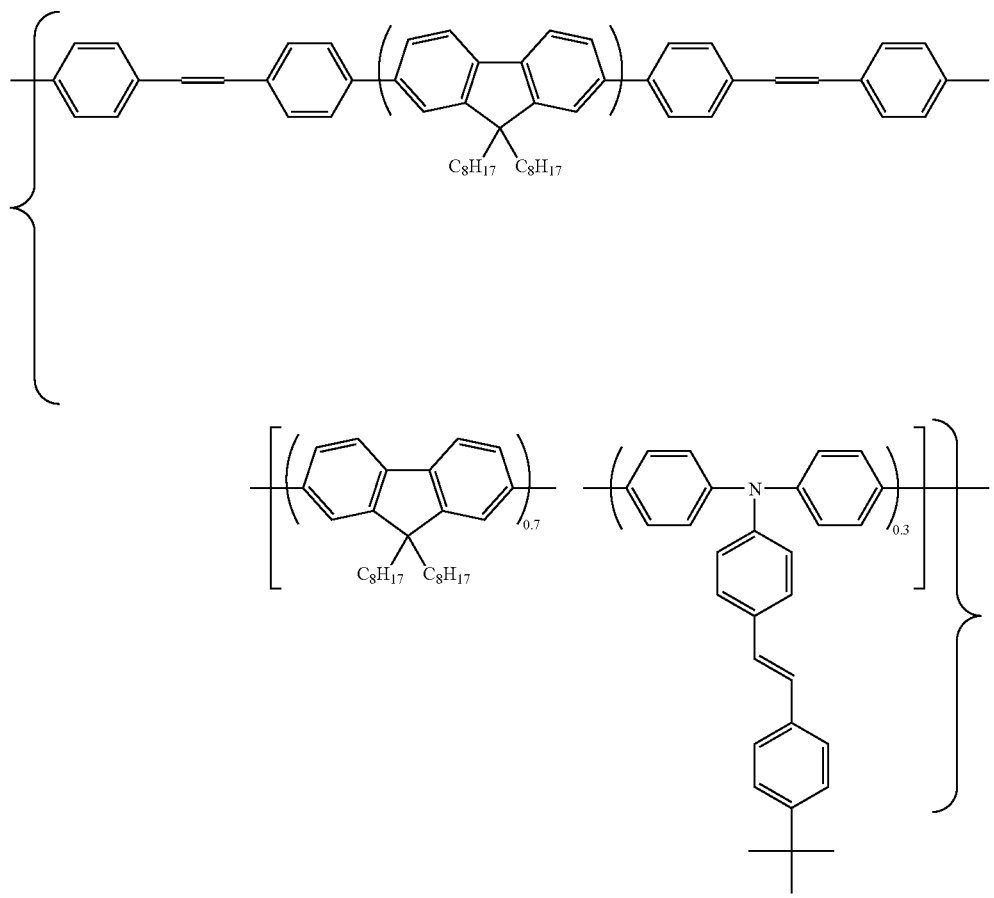

As a result of measuring the fluorescence spectrum of the thin film of resulting polymeric fluorescent substance 6 by a method described in Example 9, the peak wavelength of fluorescence was 456 nm, which was longer than that of polyfluorene which constitutes the blocks of polymeric fluorescent substance 6 by 28 nm.

EXAMPLE 7

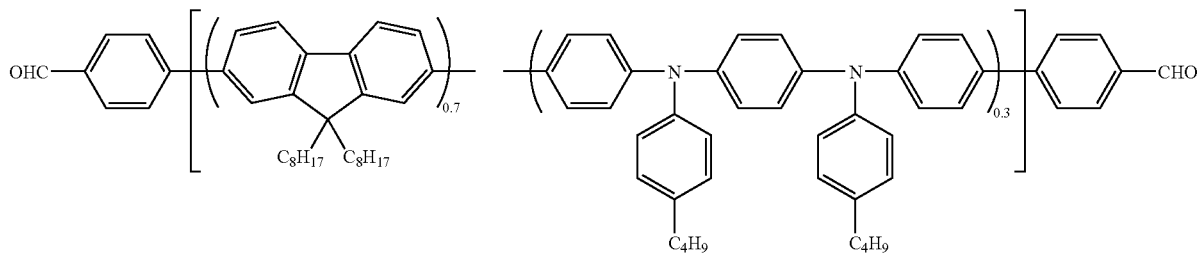

<Synthesis of Initial Polymer (9)>

0.9 g of polymers 9 was obtained as the same manner with the synthesis of Example 1 <polymer 1> except that 1.64 g of 9,9-dioctyl-2,7-dibromo fluorene, 1.0 g of N,N'-bis(4-bromophenyl)-N,N'-diphenyl phenylenediamine, 0.09 g of 4-bromo benzaldehyde, 1.65 g of 2,2'-bipyridyl, 3.0 g of bis(1,5-cyclooctadiene)nickel(0) were used as the raw materials. The polystyrene reduced weight average molecular weight of resulting polymer was $3.9 \times 10^4$, and the number average molecular weight was $1.4 \times 10^4$.

The unit included in the structure of the initial polymer (9) expected from charged monomers is as follows.

<Synthesis of Polymeric Fluorescent Substance 7>

0.24 g of polymeric fluorescent substances 7 was obtained as the same manner with the synthesis of Example 3 <polymeric fluorescent substance 3>, except that 0.2 g of the above initial polymer (9), 0.2 g the above initial polymer (8), and 0.1 g of t-butoxy potassium were used as the raw materials.

The polystyrene reduced weight average molecular weight of the resulting polymeric fluorescent substance 7 was $6.3 \times 10^4$, and the number average molecular weight was $2.1 \times 10^4$.

The unit included in the structure of polymeric fluorescent substance 7 expected from charged monomers is as follows.

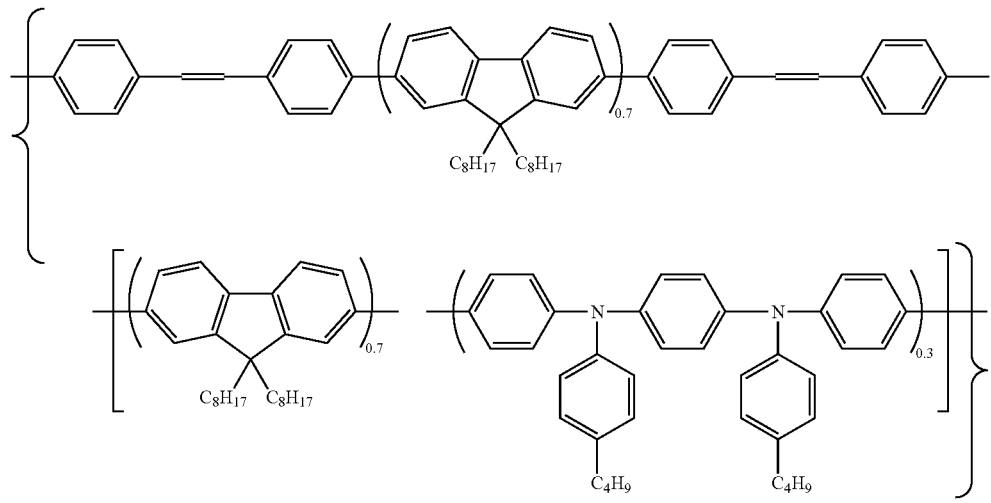

As a result of measuring the fluorescence spectrum of the thin film of the resulting polymeric fluorescent substance 7 by a method described in Example 9, the peak wavelength of fluorescence was 474 nm, which was longer than that of polyfluorene which constitutes the blocks of polymeric fluorescent substance 7 by 46 nm.

EXAMPLE 8

<Synthesis of Initial Polymer (10)>

0.9 g of initial polymer (10) was obtained as the same manner with the synthesis of Example 1 <initial polymer (1)>, except that 1.54 g of 1,4-dibromo-2,5-bis(3,7-dimethyloctyloxy) benzene, 1.6 g of N,N-bis(4-bromophenyl)-N',N'-diphenyl phenylenediamine, 0.09 g of 4-bromo benzaldehyde, 2.2 g of 2,2'-bipyridyl, and 4.0 g of bis(1,5-cyclooctadiene)nickel(0) were used as the raw materials. The polystyrene reduced weight average molecular weight of resulting polymer was $2.0 \times 10^4$, and the number average molecular weight was $1.1 \times 10^4$. The unit included in the structure of initial polymer (10) expected from charged monomers is as follows.

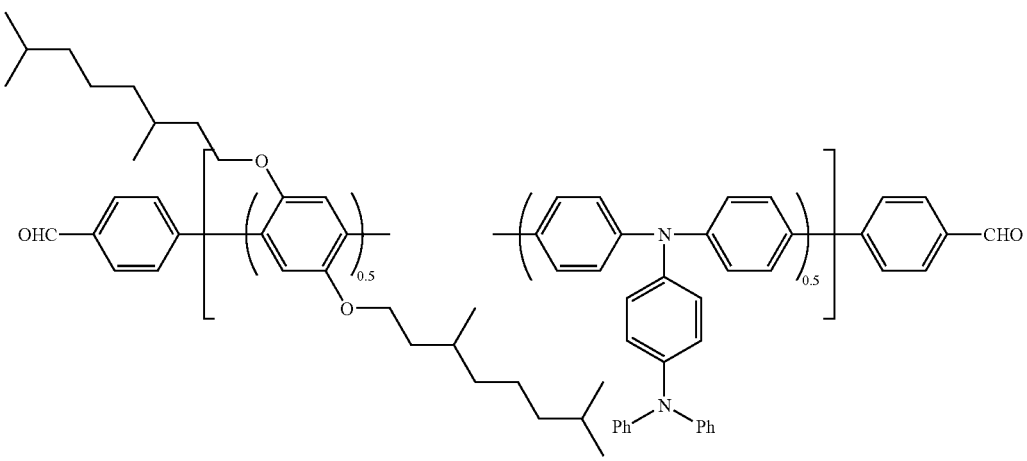

<Synthesis of Initial Polymer (11)>

0.4 g of initial polymer (11) was obtained as the same manner with the synthesis of Example 3 <initial polymer (4)>, except that 1.46 g of 4,4'-dibromo-3,3'-bis(3,7-dimethyloctyloxy)stilbene, 0.21 g of 4-bromo benzylphosphonic acid diethyl ester, 0.83 g of 2,2'-bipyridyl, 1.5 g of 2.7 bis(1,5-cyclooctadiene)nickel(0) were used as the raw materials. The polystyrene reduced weight average molecular weight of resulting polymer was 8.8×10³, and the number average molecular weight was 7.8×10³.

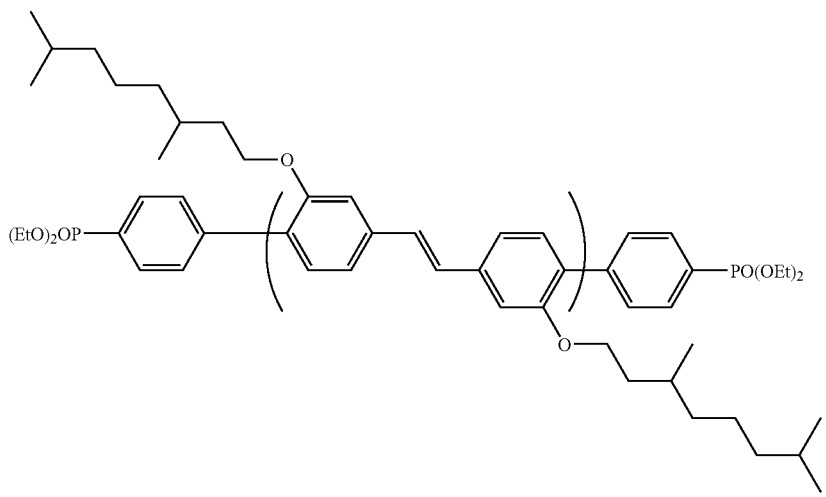

<Synthesis of Polymeric Fluorescent Substance 8>

0.12 g of polymeric fluorescent substances 7 was obtained as the same manner with the synthesis of Example 3 <polymeric fluorescent substance 3> except that 0.1 g of the above initial polymer (10), 0.14 g of the above initial polymer (11) and 0.1 g of t-butoxy potassium were used as the raw materials. The polystyrene reduced weight average-molecular weight of resulting polymer was 6.8×10⁴, and the number average molecular weight was 1.8×10⁴.

The unit included in the structure of polymeric fluorescent substance 8 expected from charged monomers is as follows.

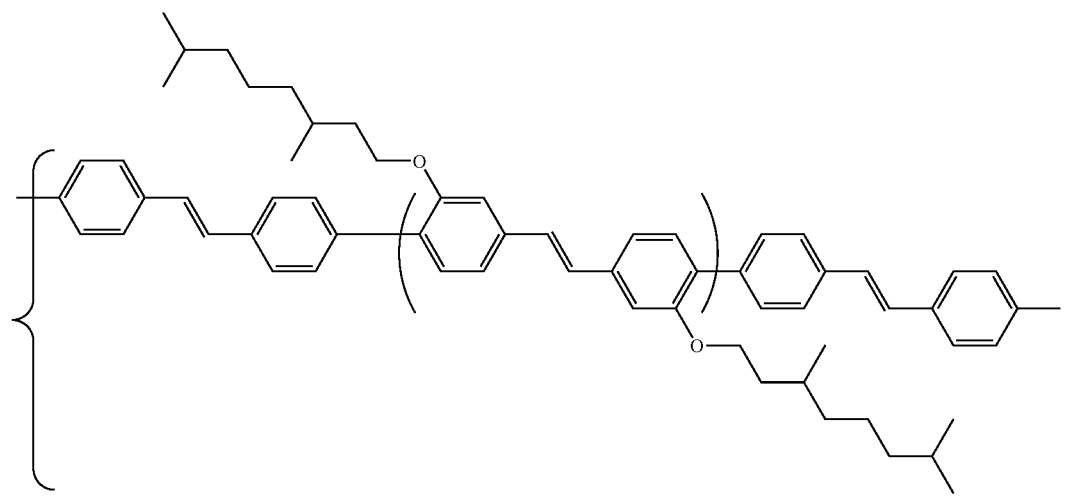

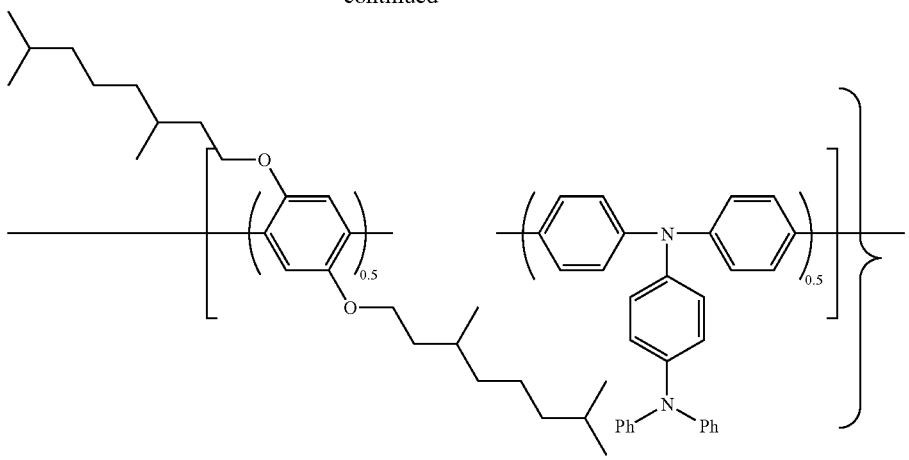

COMPARATIVE EXAMPLE 3

<Synthesis of Referential Polymer 2>

0.28 g of referential polymers 2 was obtained as the same manner with the synthesis of Example 1 <polymer 1>, except that 0.71 g of 4,4'-dibromo-3,3'-bis(3,7-dimethyloctyloxy) stilbene, 0.5 g of 2,2'-bipyridyl, and 1.0 g of bis(1,5-cyclooctadiene)nickel(0) were used as the raw materials. The polystyrene reduced weight average molecular weight of resulting polymer was $2.1 \times 10^5$, and the number average molecular weight was $5.3 \times 10^4$.

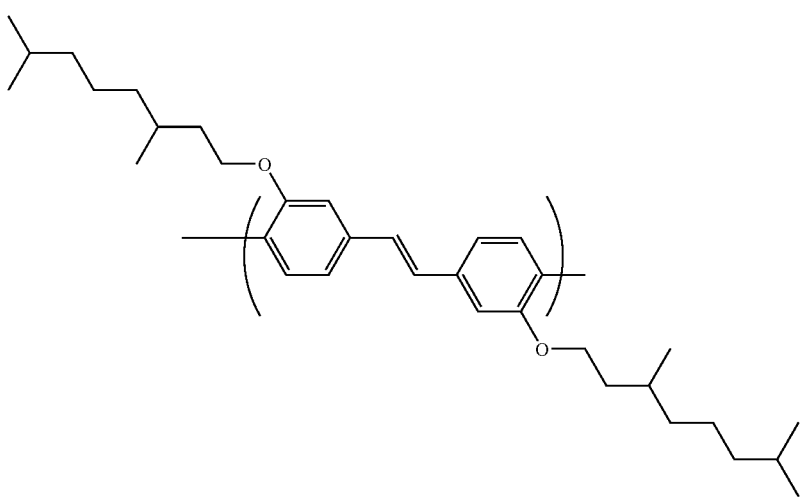

As a result of measuring the fluorescence spectrum of the thin film of resulting polymeric fluorescent substance 8 by a method described in Example 9, the peak wavelength of fluorescence is 465 nm, which was longer than that of the fluorescence peak wavelength 438 nm of referential polymer 2 which is constitutes the blocks of polymeric fluorescent substance 8 by 27 nm.

EXAMPLE 9

<Fluorescence Characteristics>

Each of the 0.2 wt % chloroform solution of polymeric fluorescent substances (1)–(8) were spin-coated on quartz, and thin films of the polymeric fluorescent substances were formed, respectively. The fluorescence spectrum of these thin films were measured using a spectrophotofluorometer (Hitachi 850). All of them-showed strong fluorescence.

EXAMPLE 10

<Production and Evaluation of Device>

On a glass substrate on which ITO film was formed in a thickness of 150 nm by sputtering method, a film was formed by a thickness of 50 nm with a spin coat using a solution (Bayer Co., Baytron P) of poly (ethylenedioxythiophene)/polystyrene sulfonic acid, and then it was dried at 120° C. for 10 minutes on a hot plate. Next, a film was formed by spin-coating, using 1.5% toluene solutions of polymeric fluorescent substance (1) in a thickness of about 100 nm. After drying this at 80° C. under reduced pressure for 1 hour, a polymer LED was fabricated, by depositing about 4 nm of LiF as the cathode buffer layer, about 25 nm of calcium, and subsequently, about 40 nm of aluminum as the cathode. Here, the vacuum degree during the deposition was 1–8×10$^{-6}$ Torra or less.

By applying a voltage to the obtained device, EL light emission from polymeric fluorescent substance (1) was observed. The intensity of EL light emission was approximately proportional to the current density.

As for this device, luminance exceeded 1 cd/m$^2$ at about 5.3V, and the light emitting efficiency reached to the maximum of 3.2 cd/A, and the maximum luminance reached to 13000 cd/m$^2$.

EXAMPLE 11

<Preparation and Evaluation of Device>

A polymer LED was produced as the same manner with Example 10 except that polymeric fluorescent substance (4) was used instead of polymeric fluorescent substance (1). Degree of vacuum at the time of deposition were always 1–8×10$^{-6}$ Torrs. By applying voltage to the resulting device, EL luminescence from polymeric fluorescent substance (4) was obtained. The strength of EL luminescence was approximately proportional to the current density.

As for this device, luminance exceeded 1 cd/m$^2$ at about 6.1V, the light emitting efficiency showed the maximum of 1.8 cd/A, and the maximum luminance showed 10440 cd/m$^2$.

EXAMPLE 12

<Production and Evaluation of Device>

A polymer LED was produced as the same manner with Example 10, except that polymeric fluorescent substance (5) was used instead of polymeric fluorescent substance (1). The degree of vacuum at the time of deposition were always 1–8×10$^{-6}$ Torr. By applying voltage to the resulting device, EL luminescence from polymeric fluorescent substance (5) was obtained. The strength of EL luminescence was approximately proportional to the current density.

As for this device, luminance exceeded 1 cd/m$^2$ at about 6.3V, the light emitting efficiency showed a maximum of 2.2 cd/A, and maximum luminance showed 10542 cd/m$^2$.

INDUSTRIAL APPLICABILITY

The polymeric fluorescent substance of the present invention has strong fluorescence and/or excellent charge transportation ability, and they can be suitably used as a light-emitting material or a charge transporting material for polymer LED.

Moreover, the polymeric fluorescent substance of the present invention can also be used as coloring matters for laser, materials for organic solar-battery, organic semiconductors for organic transistor, materials for conductive thin-film, such as a conductive thin film and an organic-semiconductor thin film.

Furthermore, the polymer LED using this polymeric fluorescent substance is a high performance polymer LED which can be driven at a low-voltage and with efficiency.

Therefore, the polymer LED can be preferably used for apparatus, such as a curved or flat light source as a back light or lighting of a liquid crystal display, a segment type display device, and a flat-panel display of dot matrix.

The invention claimed is:
1. A block copolymer comprising two or more blocks and having fluorescence in the solid state, in each of the blocks, one or more kinds of repeating unit are bonded through conjugated bonds, and the polystyrene reduced number average molecular weight of at least one block is 1×10$^3$ to 1×10$^8$, wherein the block copolymer is represented by general formula (1a) or (1b)

-A-block-(B)-block-C- (1a)

(wherein, A and C represent blocks which may be the same or different; B represents a junction unit having a conjugated bond; the fluorescence peak wavelength shown by a thin film of the polymer represented by general formula (1a) is longer by 5 nm or more than the fluorescence peak wavelengths shown by either a thin film of the polymer solely composed of block A, or a thin film of the polymer solely composed of block C), -A-block-C- (1b)

(wherein, A and C represent blocks which are mutually different, the fluorescence peak wavelength shown by a thin film of the polymer represented by general formula (1b) is longer by 5 nm or more than the fluorescence peak wavelength shown by a thin film of the polymer solely composed of block A), wherein at least one of A and C which represent blocks in the above formula (1a) or (1b) has one or more kinds of the repeating unit represented by the below formula (3),

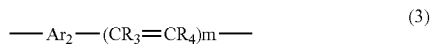

(3)

(wherein, Ar$_2$ is a divalent aromatic amine group represented by the following general formula (4), R$_3$ and R$_4$ each independently represent a group selected from a hydrogen atom, an alkyl group, an aryl group, a monovalent heterocyclic compound group and a cyano group, and m is 0 or 1)

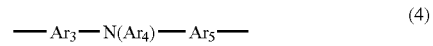

(4)

(wherein, Ar$_3$ and Ar$_5$ are each independently an arylene group, an aromatic compound group represented by the following general formula (5), or a group having an aromatic amine skeleton represented by the following general formula (6), and Ar$_4$ represents an aryl group, a monovalent heterocyclic compound group, or a group having an aromatic amine skeleton represented by the following general formula (7), or a group having an aromatic ethenylene skeleton represented by the following general formula (8); a ring may be formed between Ar$_3$ and Ar$_4$, between Ar$_4$ and Ar$_5$, or between Ar$_3$ and Ar$_5$)

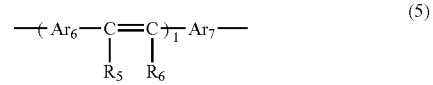

(5)

(wherein, Ar$_6$ and Ar$_7$ each independently represent an arylene group, R$_5$ and R$_6$ are the same group with those of R$_3$ and R$_4$ and l is 0 or 1)

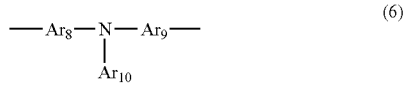

(wherein, $Ar_8$ and $Ar_9$ each independently represent an arylene group, and $Ar_{10}$ represent an aryl group, a ring may be formed between $Ar_8$ and $Ar_{10}$, between $Ar_8$ and $Ar_9$, or between $Ar_9$ and $Ar_{10}$)

(wherein, $Ar_{11}$ represents an arylene group, $R_7$ and $R_8$ each independently represent the same group with those of $R_3$ and $R_4$, and a ring may be formed between $Ar_{11}$ and $R_7$, between $Ar_{11}$ and $R_8$, or between $R_7$ and $R_8$)

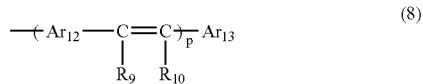

(wherein, $Ar_{12}$ and $Ar_{13}$ each independently represent an arylene group, $R_9$ and $R_{10}$ each independently represent the same group with those of $R_3$ and $R_4$, and p is 0 or 1).

2. A block copolymer according to claim 1, wherein $Ar_2$ in the above formula (3) is a block copolymer represented by the below formula (9),

(wherein, $Ar_{14}$ and $Ar_{16}$ represent the same group with those of $Ar_3$ and $Ar_5$, and $Ar_{15}$ represents the same group with those of $Ar_4$ and t is 1 or 2).

3. A block copolymer according to claim 1, wherein the junction unit B in the above formula (1a) is represented by the following general formula (10), when m is 0 in the above formula (3),

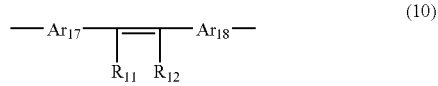

(wherein, $Ar_{17}$ and $Ar_{18}$ are an arylene group or a divalent heterocyclic compound group, and $R_{11}$ and $R_{12}$ represent the same group with those of $R_1$ and $R_2$).

4. A block copolymer according to claim 1, wherein the junction unit B in the above formula (1a) is a block copolymer represented by the following general formula (11), when m is 1 in the above formula (3),

(wherein, $Ar_{19}$ is an arylene group or a divalent heterocyclic compound group).

5. A polymeric fluorescent substance composition comprising the block copolymer according to claim 1.

6. A polymeric fluorescent substance composition according to claim 5, wherein the composition comprises the block copolymer in an amount of 10% by weight or more.

7. A process for producing a block copolymer, wherein an initial polymer having a group ($Y_1$) on the molecular terminal, is obtained by reacting a monomer (I) having two reactive groups ($X_1$, $X_2$) in a molecule which can react mutually, with a monomer (II) having a reactive group ($X_3$) which is reactive with the reactive groups ($X_1$, $X_2$) and a group ($Y_1$) which is not reactive with the reactive groups ($X_1$, $X_2$) under a reaction condition at which said reactive groups ($X_1$, $X_2$) can react with $X_3$ to form a linkage; and said initial polymer is reacted under a condition at which group ($Y_1$) can mutually react to form linkage.

8. A process for producing a block copolymer, wherein an initial polymer having a group ($Y_1$) on the molecular terminal, is obtained by reacting a monomer (I) having two reactive groups ($X_1$, $X_2$) in a molecule which can react mutually, with a monomer (II) having a reactive group ($X_3$) which is reactive with the reactive groups ($X_1$, $X_2$) and a group ($Y_1$) which is not reactive with the reactive groups ($X_1$, $X_2$) under a reaction condition at which said reactive groups ($X_1$, $X_2$) can react with $X_3$ to form a linkage; and said initial polymer is reacted with a monomer (III) having two groups ($Y_2$, $Y_3$) in a molecule which is reactive with a group ($Y_1$) to form a linkage under a reaction condition at which groups ($Y_2$, $Y_3$) can react with group ($Y_1$) to form a linkage.

9. A process for producing a block copolymer according to claim 7 or 8, wherein two or more kinds of the initial polymer are used.

10. A process for producing a block copolymer according to claim 8, wherein the above groups ($Y_1$, $Y_2$, $Y_3$) are those which can generate $\pi$—$\pi$ bond.

11. A process for producing a block copolymer according to claim 10, wherein the $\pi$—$\pi$ bond generated by the reaction of the above groups ($Y_1$, $Y_2$, $Y_3$) is a double bond.

12. A process for producing a block copolymer according to claim 7, wherein the monomer (I) is one or more kinds of monomer represented by the below formula (12), and the monomer (II) is one or more kinds of monomer represented by the below formula (13),

(wherein, $X_1$ and $X_2$ represent reactive groups which react mutually to form a linkage, and these may be the same or different; $Ar_{20}$ represents the same group with those of the above $Ar_1$)

(wherein, $Ar_{21}$ represents the same group with those of $Ar_1$. $X_3$ represents a reactive group which reacts mutually with the above $X_1$, $X_2$, and $X_3$ to form a linkage, and $Y_1$ represents a group which does not react, under a reaction condition at which $X_1$, $X_2$ and $X_3$ can react to form a linkage).

13. A process for producing a block copolymer according to claim 8, wherein monomer (III) is a monomer represented by the below formula (14),

(wherein, $Ar_{25}$ represents the same group with those of $Ar_1$. $Y_2$ and $Y_3$ each independently represent the same group with those of $Y_1$, and they may be the same or different).

14. A process for producing a block copolymer according to claim 12 or 13, wherein $X_1$, $X_2$ and $X_3$ in the monomer shown by formulas (12) and (13) each independently represent a halogen atom, alkylsulfonyloxy group which may be substituted by a fluorine atom, arylsulfonyloxy group which may be substituted by an alkyl group, boric acid, or boric ester (wherein, at least one of them are a halogen atom, alkylsulfonyloxy group which may be substituted by a fluorine atom, or arylsulfonyloxy group which may be substituted by an alkyl group); and $Y_1$, $Y_2$ and $Y_3$ in the monomer shown by formulas (13) and (14) each independently represent an aldehyde group, a carbonyl group, a phosphonate, or a phosphonium salt (wherein, at least one of them are an aldehyde group, or a carbonyl group).

15. A process for producing a block copolymer according to claim 12 or 13, wherein $X_1$, $X_2$ and $X_3$ in the monomer shown by formulas (12) and (13) each independently represent an aldehyde group, a carbonyl group, phosphonate group, or a phosphonium salt (wherein, at least one of them are an aldehyde group or a carbonyl group); and $Y_1$, $Y_2$ and $Y_3$ in the monomer shown by formulas (13) and (14) each independently represent a halogen atom, an alkylsulfonyloxy group which may be substituted by a fluorine atom, or an arylsulfonyloxy group which may be substituted by an alkyl group, a boric acid or a boric ester (wherein, at least one of them are a halogen atom, an arylsulfonyloxy group which may be substituted by an alkyl sulfonyloxy group or an alkyl group which may be substituted by a fluorine atom.

16. A process for producing a block copolymer according to claim 12 or 13, wherein at least one group selected from $X_1$, $X_2$ and $X_3$ in the monomer shown by formulas (12) and (13) is a boric acid or a boric ester, at least one group is a halogen atom, an alkylsulfonyloxy group which may be substituted by a fluorine atom, or an arylsulfonyloxy group which may be substituted by an alkyl group; $Y_1$ in the monomer shown by general formula (13), and $Y_2$ and $Y_3$ in the monomer shown by general formula (14) are reactive groups selected from an aldehyde group, a carbonyl group, a phosphonate group, or a phosphonium salt; and the initial polymer is obtained by a reaction under existence of Pd(0) catalyst.

17. A process for producing a block copolymer according to claim 12 or 13, wherein $X_1$, $X_2$ and $X_3$ in the monomer shown by formulas (12) and (13) are a halogen atom, an alkylsulfonyloxy group which may be substituted by a fluorine atom, or an arylsulfonyloxy group which may be substituted by an alkyl group; $Y_1$ in the monomer shown by general formula (13), and $Y_2$ and $Y_3$ in the monomer shown by general formula (14) are reactive groups selected from an aldehyde group, a carbonyl group, a phosphonate group, or a phosphonium salt; and the initial polymer is obtained by a reaction under existence of Ni(0).

18. A process for producing a block copolymer according to claim 12 or 13, wherein at least one group of $X_1$, $X_2$ and $X_3$ in the monomer shown by formulas (12) and (13) is an aldehyde group or a carbonyl group, at least one group is a phosphonate or a phosphonium salt; $Y_1$ in the monomer shown by general formula (13), and $Y_2$ and $Y_3$ in the monomer shown by general formula (14) are reactive groups selected from a halogen atom, an alkylsulfonyloxy group which may be substituted by a fluorine atom, or an arylsulfonyloxy group which may be substituted by an alkyl group; and the initial polymer is obtained by a reaction under existence of a base.

19. A polymer light-emitting device comprising a pair of electrodes composed of an anode and a cathode at least one of which is transparent or semitransparent and at least containing a light emitting layer between the electrodes, wherein the light emitting layer comprises a block copolymer according to claim 1.

20. A polymer light-emitting device comprising a pair of electrodes composed of an anode and a cathode at least one of which is transparent or semitransparent and at least containing a light emitting layer between the electrodes, wherein the light emitting layer comprises a polymeric fluorescent substance composition according to claim 5 or 6.

21. A polymer light-emitting device according to claim 19, wherein a layer comprising an electron-transporting compound is disposed between the cathode and the light emitting layer such that the layer comprising an electron-transporting compound is adjacent to said light-emitting layer.

22. A polymer light-emitting device according to claim 19, wherein a layer comprising a hole-transporting compound is disposed between the anode and the light emitting layer such that the layer comprising a hole-transporting compound is adjacent to said light-emitting layer.

23. A polymer light-emitting device according to claim 19, wherein a layer comprising an electron-transporting compound is disposed between the cathode and the light emitting layer such that the layer comprising an electron-transporting compound is adjacent to said light-emitting layer, and a layer comprising a hole-transporting compound is disposed between the anode and the light emitting layer such that the layer comprising a hole-transporting compound is adjacent to said light-emitting layer.

24. A flat light source comprising a polymer light-emitting device according to claim 19.

25. A segment display comprising a polymer light-emitting device according to claim 19.

26. A dot matrix display comprising a polymer light-emitting device according to claim 19.

27. A liquid crystal display comprising a polymer light-emitting device according to claim 19 as a back light.

28. A electronic device comprising a display according to any one of claims 25 to 27 as a display part.

* * * * *